(12) United States Patent
Nassar et al.

(10) Patent No.: US 9,117,845 B2
(45) Date of Patent: Aug. 25, 2015

(54) PRODUCTION OF LATERALLY DIFFUSED OXIDE SEMICONDUCTOR (LDMOS) DEVICE AND A BIPOLAR JUNCTION TRANSISTOR (BJT) DEVICE USING A SEMICONDUCTOR PROCESS

(71) Applicant: Fairchild Semiconductor Corporation, San Jose, CA (US)

(72) Inventors: Christopher Nassar, Portland, ME (US); Sunglyong Kim, Falmouth, ME (US); Steven Leibiger, Falmouth, ME (US); James Hall, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/751,041

(22) Filed: Jan. 25, 2013

(65) Prior Publication Data

US 2014/0213024 A1    Jul. 31, 2014

(51) Int. Cl.
| | |
|---|---|
| H01L 27/06 | (2006.01) |
| H01L 21/336 | (2006.01) |
| H01L 21/02 | (2006.01) |
| H01L 29/73 | (2006.01) |
| H01L 29/66 | (2006.01) |
| H01L 29/06 | (2006.01) |
| H01L 29/78 | (2006.01) |
| H01L 21/04 | (2006.01) |
| H01L 29/732 | (2006.01) |
| H01L 49/02 | (2006.01) |
| H01L 21/8249 | (2006.01) |
| H01L 29/16 | (2006.01) |
| H01L 29/20 | (2006.01) |

(52) U.S. Cl.
CPC .... *H01L 29/66681* (2013.01); *H01L 21/02595* (2013.01); *H01L 21/0415* (2013.01); *H01L 21/8249* (2013.01); *H01L 27/0623* (2013.01); *H01L 27/0629* (2013.01); *H01L 27/0635* (2013.01); *H01L 28/20* (2013.01); *H01L 29/0634* (2013.01); *H01L 29/66272* (2013.01); *H01L 29/7322* (2013.01); *H01L 29/7816* (2013.01); *H01L 29/7817* (2013.01); *H01L 29/1608* (2013.01); *H01L 29/20* (2013.01)

(58) Field of Classification Search
CPC ............ H01L 21/8249; H01L 27/0635; H01L 27/0623; H01L 27/0629; H01L 21/0415; H01L 21/02595; H01L 29/7816; H01L 29/7817; H01L 29/0634; H01L 29/66681
USPC .................................................. 438/286, 527
See application file for complete search history.

(56) References Cited

U.S. PATENT DOCUMENTS

| | | | |
|---|---|---|---|
| 5,406,110 A * | 4/1995 | Kwon et al. ................... 257/493 |
| 6,204,105 B1 | 3/2001 | Jung | |
| 6,313,516 B1 | 11/2001 | Tsui et al. | |
| 6,700,474 B1 | 3/2004 | Leibiger | |
| 6,885,280 B2 | 4/2005 | Olson | |

(Continued)

*Primary Examiner* — Su C Kim
*Assistant Examiner* — Regan J Rundio
(74) *Attorney, Agent, or Firm* — Brake Hughes Bellermann LLP

(57) ABSTRACT

In one general aspect, a method can include implanting a first dopant, simultaneously, in a portion of a laterally diffused metal oxide semiconductor (LDMOS) device and in a portion of a resistor device included in a semiconductor device. The method can also include implanting a second dopant, simultaneously, in a portion of the LDMOS device and in a portion of a bipolar junction transistor (BJT) device in the semiconductor device.

20 Claims, 22 Drawing Sheets

(56) References Cited

U.S. PATENT DOCUMENTS

| | | |
|---|---|---|
| 7,691,717 B2 | 4/2010 | Chinthakindi et al. |
| 8,581,316 B2 | 11/2013 | Inoue et al. |
| 2004/0251517 A1* | 12/2004 | Nakashima ............... 257/565 |
| 2008/0176370 A1 | 7/2008 | Ko et al. |
| 2010/0102386 A1* | 4/2010 | You ............................ 257/336 |
| 2011/0012170 A1* | 1/2011 | Ohtsuka et al. ............ 257/121 |
| 2011/0127602 A1* | 6/2011 | Mallikarjunaswamy ..... 257/331 |
| 2011/0303977 A1* | 12/2011 | Huang et al. ................ 257/339 |
| 2012/0007103 A1* | 1/2012 | Domeij ........................ 257/77 |

\* cited by examiner

| Electrical Parameters 800 | NPN BJT with Drift Region 810 | NPN BJT with P-Well 820 | PNP BJT with Drift Region 830 | PNP BJT with N-Well 840 |
|---|---|---|---|---|
| Beta (β) Value | 4 | 1 | 4 | 1 |
| BVceo Value | 2 | 1 | 1 | 1 |
| BVcbo Value | 2 | 1 | 1 | 1 |

PRODUCTION OF LATERALLY DIFFUSED OXIDE SEMICONDUCTOR (LDMOS) DEVICE AND A BIPOLAR JUNCTION TRANSISTOR (BJT) DEVICE USING A SEMICONDUCTOR PROCESS

TECHNICAL FIELD

This description relates to production of multiple semiconductor devices using a semiconductor process.

BACKGROUND

In a typical semiconductor process, multiple mutually exclusive process steps are used to produce separate semiconductor devices. For example, dedicated photolithographic, masking, and ion implantation process steps are often used to produce a polysilicon resistor within a semiconductor process. As another example, dedicated photolithographic masking and ion implantation process steps may be specifically adjusted for production of a bipolar junction transistor in a semiconductor process. These dedicated process steps can increase the cost and cycle time of individual wafers by as much as 5% or more, which can be significant both in terms of product gross margin and fab capacity. Thus, a need exists for systems, methods, and apparatus to address the shortfalls of present technology and to provide other new and innovative features.

SUMMARY

In one general aspect, a method can include implanting a first dopant, simultaneously, in a portion of a laterally diffused metal oxide semiconductor (LDMOS) device and in a portion of a resistor device included in a semiconductor device. The method can also include implanting a second dopant, simultaneously, in a portion of the LDMOS device and in a portion of a bipolar junction transistor (BJT) device in the semiconductor device.

The details of one or more implementations are set forth in the accompanying drawings and the description below. Other features will be apparent from the description and drawings, and from the claims.

BRIEF DESCRIPTION OF THE DRAWINGS

FIG. 8 is a diagram that illustrates a table related to electrical parameters of BJT devices.

DETAILED DESCRIPTION

The disclosure herein is related to semiconductor devices that can be produced using one or more process steps within a semiconductor process overlapping or corresponding with one or more process steps used to produce other semiconductor devices. For example, a process step that is used to produce a portion of a first semiconductor device can also be used to produce a portion of a second semiconductor device. In other words, the same process step can be used to produce different portions of different semiconductor devices within an integrated circuit. The process step, which can be an existing process step that is typically used to produce the portion of the first semiconductor device, may be used, in an unexpected fashion, to produce the portion of the second semiconductor device. The disclosure herein can be related to processes used to produce a variety of devices including polysilicon resistors (resistor devices), capacitors, bipolar junction transistor (BJT) devices (e.g., NPN BJT devices, PNP BJT devices), complementary metal-oxide semiconductor (CMOS) devices (e.g., P-type metal oxide semiconductor field effect transistor (MOSFET) (PMOSFET or PMOS) devices, N-type MOSFET (NMOSFET or NMOS) devices), laterally diffused metal oxide semiconductor (LDMOS) devices (e.g., N-type LDMOS (LNDMOS) devices, P-type LDMOS (LPDMOS) devices), and/or so forth. A semiconductor process including at least BJT devices, CMOS devices, LDMOS devices can be referred to as a BCDMOS process.

Figure 1:
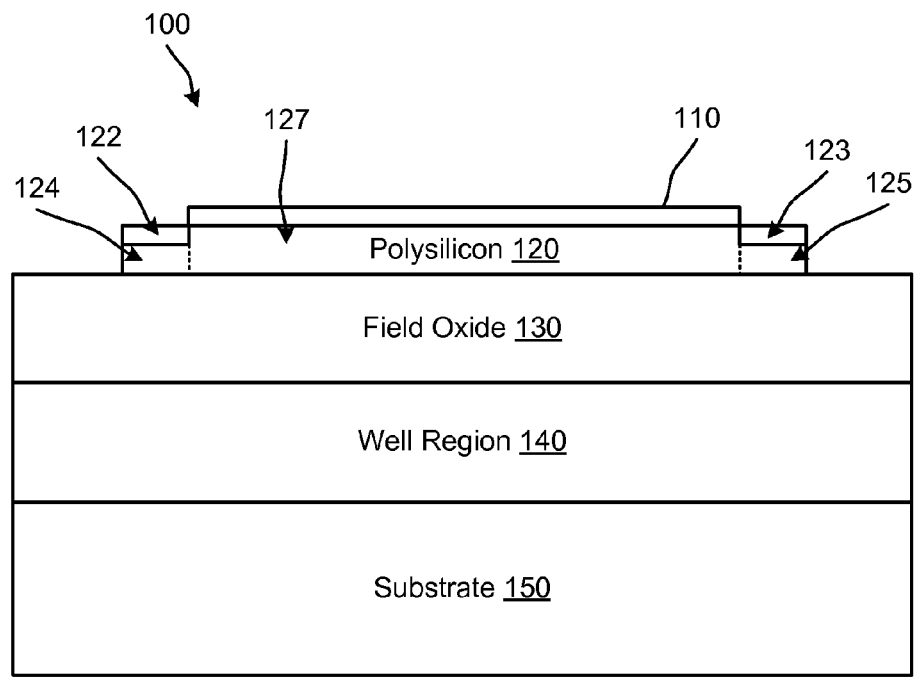
FIG. 1 is a block diagram that illustrates a side cross-sectional view of a polysilicon resistor, according to an embodiment.

FIG. 1 is a block diagram that illustrates a side cross-sectional view of a polysilicon resistor 100, according to an embodiment. The polysilicon resistor 100 can be produced using one or more process steps within a semiconductor process that are typically used to produce other types of semiconductor devices. The one or more process steps are used, in an unexpected fashion, to produce the polysilicon resistor 100.

As shown in FIG. 1, the polysilicon resistor 100 includes a polysilicon 120 disposed on a field oxide 130 (also can be referred to as a field oxide layer). The field oxide 130 is disposed above a well region 140 (regions can also be referred to as implants in some embodiments), which is implanted (e.g., doped) into a substrate 150. As shown in FIG. 1, the well region 140 is disposed between the field oxide 130 and a bulk portion of the substrate 150. In some embodiments, the well region 140 can be a region including a p-type dopant (e.g., boron (B)) (which can be referred to as a p-type well region or as a p-well region) or can be a region including an n-type dopant (e.g., phosphorus (P), arsenic (As)) (which can be referred to as an n-type well region or as an n-well region). In some embodiments, an implant process (also can be referred to as an implanation process) can include a dopant type (e.g., a dopant have an N-type conductivity type (also can be referred as an N-type dopant), a dopant have a P-type conductivity type (also can be referred as a P-type dopant)), a dopant level (or dose), an angle, a duration, an acceleration, and/or so forth. In some embodiments an N-type conductivity or dopant can be referred to as a first conductivity type or dopant and a P-type conductivity or dopant can be referred to as a second conductivity type or dopant, or vice versa.

Also as shown in FIG. 1, the polysilicon 120 (also can be referred to as a polysilicon layer) includes silicide portions (or layers) 122, 123, and includes doped portions 124, 125. In some embodiments, one or more of the doped portions 124, 125 can include a p-type dopant or an n-type dopant. In some embodiments, the doped portion 124 and/or the doped portion 125 can be heavily doped so that a contact between the silicide portion 122 and/or the silicide portion 123 and the doped portion 124 and/or the doped portion 125 is an ohmic contact as opposed to a rectifying contact. A resistor body region 127 of the polysilicon 120 is disposed between the doped portions 124, 125 and between the silicide portions 122, 123. In some embodiments, the resistor body region 127 can be a doped portion of an intrinsic portion of the polysilicon 120. In some embodiments, the doped portions 124, 125 can be referred to as contact regions. In some embodiments, the resistor body region 127 of the polysilicon 120 (which is disposed within a central portion of the polysilicon 120) can be referred to as a resistor body portion. An oxide 110, which can be a resistor protection oxide (RPO), a salicide oxide, or a silicide blocking oxide, is disposed on the resistor body region 127. In some embodiments, the silicide portions 122, 123 (which can be referred to as salicide portions) can be self-aligned to the oxide 110.

A direction from the substrate 150 to the oxide 110, or from the oxide 110 to the substrate 150 can be referred to as a vertical direction. A direction orthogonal to, or substantially orthogonal to, the vertical direction can be referred to as a horizontal direction or as a lateral direction. A depth along the vertical direction from the oxide 110 (which is oriented toward the top of FIG. 1) to the substrate 150 (which is oriented toward the bottom of FIG. 1) can be a direction of increasing depth. Unless otherwise indicated, the side cross-sectional views described herein are oriented similar to the orientation of FIG. 1.

The polysilicon resistor 100 is produced using a photolithography/masking step, etching step, and/or an implant step (e.g., a doping step) that is used elsewhere within a semiconductor process to produce other different types of semiconductor devices. In other words, certain process steps within the semiconductor process used to produce other types of semiconductor devices can overlap with (e.g., Can be performed concurrently with, can be performed simultaneously with) the process steps used to produce the polysilicon resistor 100. This overlap in process steps can result in efficiencies within the semiconductor process when producing several different types of semiconductor devices.

For example, the polysilicon resistor 100 can be produced using one or more process steps within a semiconductor process overlapping or corresponding with one or more process steps used in a BCDMOS process used to produce BJT devices, CMOS devices, and LDMOS devices. In such an embodiment where the polysilicon resistor 100 is produced within a BCDMOS process, an implant process used to dope a portion of an LDMOS device can be used to dope a portion of the polysilicon resistor 100. In other words, an implant process used to dope a portion of an LDMOS device can be the same implant process used to concurrently (or simultaneously) dope a portion of the polysilicon resistor 100. Specifically, an implant process used to produce a P− region (e.g., a relatively light P-type dopant level) as a body region of an LNDMOS device (e.g., a high voltage (HV) LNDMOS device) can also be used to produce the resistor body region 127 of the polysilicon resistor 100 (which can be a high-value polysilicon resistor (HVPR)). As another specific example, the doped portions 124, 125 of the polysilicon resister 100 can be produced using an implant process associated with a P+ region (e.g., a relatively heavy concentration of a P-type dopant), which can be the same implant process used to produce the P+ region for a source region and/or a P+ region for a drain region of a PMOS device (e.g., a low voltage (LV) PMOS device). As yet another example, a silicide process or a salicide process used for CMOS devices, LDMOS devices, and/or BJT devices can also be used to produce the silicide portions 122, 123 of the polysilicon resistor 100.

In some embodiments, an HV LDMOS device (e.g., a HV LNDMOS device, a HV LPDMOS device) or LV MOS device (e.g., a LV PMOS device, a LV NMOS device) can be configured to operate with a voltage (e.g., a breakdown voltage) between 10 V to 500 V (in absolute terms). In some embodiments, an HV LDMOS device or LV MOS device can be configured to operate with voltage less than 10V or a voltage greater than 500 V (in absolute terms). In some embodiments, an HV LDMOS device can be configured to operate with voltage less than 10V or a voltage greater than 500 V (in absolute terms). In some embodiments, a LV LDMOS device (e.g., a LV LNDMOS device, a LV LPDMOS device) or LV MOS device (e.g., a LV PMOS device, a LV NMOS device) can be configured to operate with a voltage (e.g., a breakdown voltage) between 1 V to 12 V (in absolute terms). In some embodiments, a LV LDMOS device or LV MOS device can be configured to operate with voltage less than 1V or a voltage greater than 12 V (in absolute terms). In some embodiments, the minimum feature size within a process used to produce the devices described herein can be less than 0.5 $\mu m$ (e.g., 0.2 $\mu m$, 0.13 $\mu m$, 0.07 $\mu m$). In some embodiments, the minimum feature size can be a distance between a source and a drain.

In some embodiments, an implant process can be associated with, or can include, additional process steps including a photolithography/masking step, an etching step, and/or an implant step. A process (e.g., an implant process) or process step (e.g., an implant step) that is used to concurrently (or simultaneously) form two separate features of a semiconductor device can be a process or process step that is used to form the two separate features during a concurrent time period (e.g., a first time period overlapping with a second time period), under the same conditions, using the single process or single process step, and/or so forth. This does not preclude additional (e.g., prior, subsequent) process steps to further process (e.g., define, modify) one or more the features. In some embodiments, a process can be referred to as including a set of process steps.

The cost and cycle time of wafers during a semiconductor process (e.g., a BCDMOS process) can be improved by using existing processes or process steps to produce the polysilicon resistor 100. In some embodiments, the cost and cycle time can be improved by as much as 5% or more. The cost and cycle time can be improved because photolithographic/masking, etching, and ion implantation process steps that are dedicated to the production of polysilicon resistors and that have been used for many years to produce polysilicon resistors can be avoided or eliminated from the semiconductor process. These existing process or process steps are being used in an unexpected fashion to produce the polysilicon resistor 100 because these existing process steps have not previously been used (e.g., used in a BCDMOS process) to produce a polysilicon resistor. In sum, existing process steps that are not used to produce polysilicon resistors can be efficiently used to produce polysilicon resistor 100. In some embodiments, a process step (e.g., an implantation process step) can be referred to as a step (e.g., an implantation step).

As mentioned above, the polysilicon resistor 100 can be a relatively high-value polysilicon resistor (HVPR). For example, the polysilicon resistor 100 can have a sheet resistance value of between approximately 1000 ohms (Ω) per square and 5000 Ω/sq (e.g., 1000 Ω/sq, 2000 Ω/sq, 3000 Ω/sq, 4000 Ω/sq, 5000 Ω/sq). In some embodiments, the polysilicon resistor 100 can have a resistance value less than 1000 Ω/sq or greater than 5000 Ω/sq.

Figure 2:
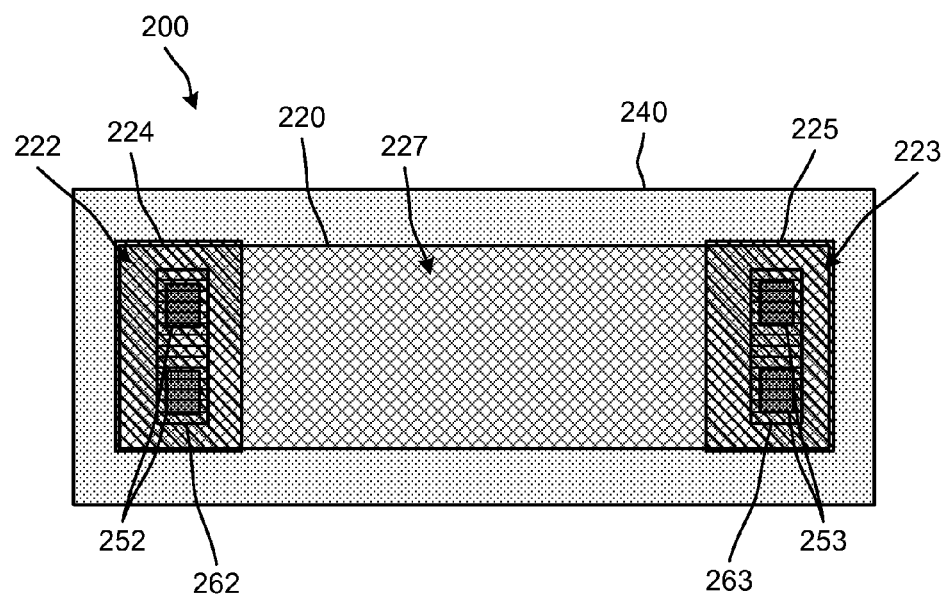
FIG. 2 is a diagram that illustrates a top mask level view of a polysilicon resistor.

FIG. 2 is a diagram that illustrates a top mask level view of a polysilicon resistor 200. As shown in FIG. 2, a polysilicon layer 220 is disposed over a well region 240 (e.g., a P-type body implant or region). The polysilicon layer 220 includes a resistor body region 227 disposed between silicide portions 222, 223 of the polysilicon layer 220. The resistor body region 227 of the polysilicon layer 220 is also disposed between doped portions 224, 225 of the polysilicon layer 220. As shown in FIG. 2 contacts 252, 253 (or vias) are disposed vertically (into and out of the figure) between the respective silicide portions 222, 223 and metal portions 262, 263 (or layers). In this embodiment, an oxide disposed on the polysilicon layer 220 is not shown.

Figure 3:
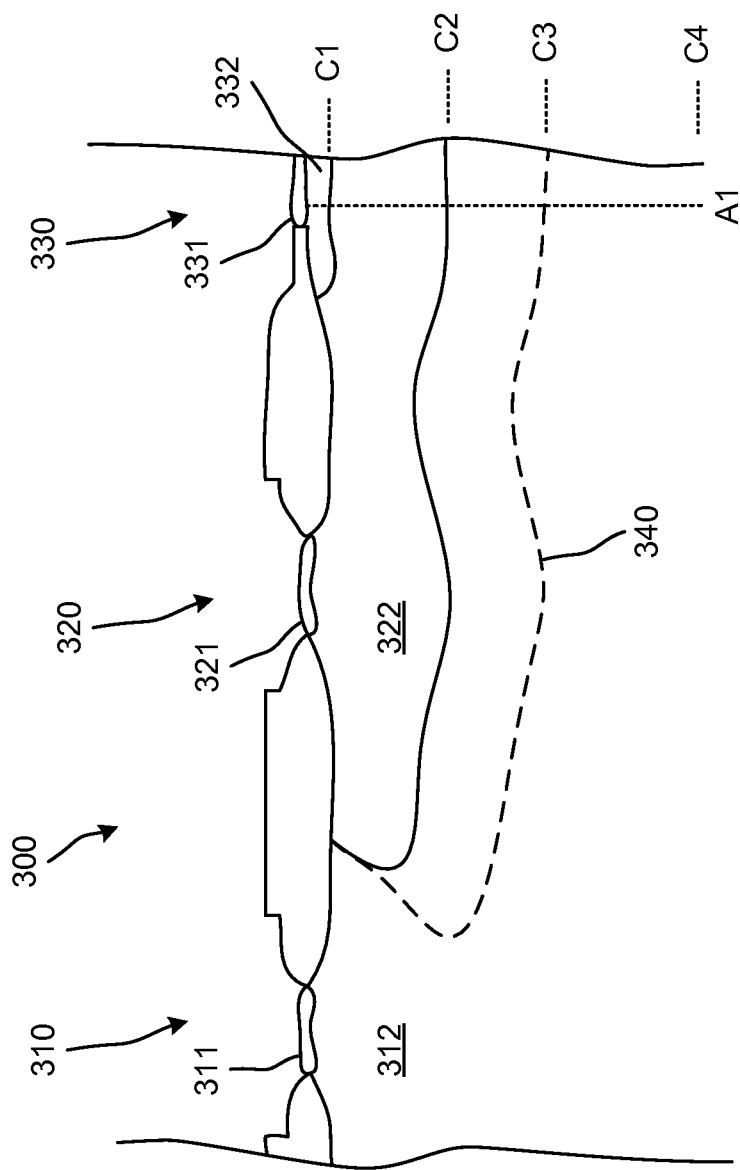
FIG. 3 is a side cross-sectional view of a bipolar junction transistor (BJT) device, according to an embodiment.

FIG. 3 is a side cross-sectional view of a BJT device 300, according to an embodiment. In this embodiment, the BJT device 300 is an NPN BJT device. The BJT device 300 can be produced using one or more process steps within a semiconductor process that are typically used to produce other types of devices (non-BJT devices) and used, in an unexpected fashion, to produce the BJT device 300.

For example, the BJT device 300 can be produced using one or more process steps within a semiconductor process overlapping or corresponding with process steps (or a process) used to produce a LDMOS device in a BCDMOS process. In such an embodiment where the BJT device 300 is produced within a BCDMOS process, an implant process (e.g., photolithography/masking, etching, implant steps) used to dope a portion of an LDMOS device can be used to dope a portion of the BJT device 300. In other words, an implant process used to dope a portion of an LDMOS device can be the same implant process used to concurrently dope a portion of the BJT device 300.

As shown in FIG. 3, the BJT device 300 includes a collector 310 (also can be referred to as a collector region), a base 320 (also can be referred to as a base region), and an emitter 330 (also can be referred to as an emitter region). The collector 310 includes silicide portion 311, the base 320 includes silicide portion 321, and the emitter 330 includes silicide portion 331. The silicide portions 311, 321, and 331 can be associated with a silicide layer. In some embodiments, the collector 310 can be referred to as a collector terminal, the base 320 can be referred to as a base terminal, and the emitter 330 can be referred to as an emitter terminal.

The collector 310 and the emitter 330 are doped with an N-type dopant, and the base 320 is doped with a P-type dopant. Specifically, the collector 310 includes an N-type region 312 (which can be referred to as a collector implant region) that is an N-type isolation region (or layer), and the emitter 330 includes an N-type region 332 (which can be referred to as an emitter implant region) that is a heavily doped N-type region (also can be referred to as an N+ region (or implant)). An implant process that is used to produce a P-type drift region for an LPDMOS device (not shown) is also used to concurrently form the P-type region 322 of the base 320 (which can be referred to as a base implant region). Accordingly, the P-type region 322 of the base 320 is a P-type drift region that corresponds with a P-type drift region of an LPDMOS device. In some embodiments, the P-type region 322 of the base 320 corresponds with a P-type drift region of an HV LPDMOS device. In some embodiments, the N-type region 312 can include one or more different types of N-type regions (or implants) including an N-type substrate, an N-type buried region, a N-type sinker region, an N-type connector region, and/or so forth. These different N-type regions can have different dopant concentrations.

By using one or more process steps that are typically used to produce a P-type drift region of an LPDMOS device, a dedicated process (or process step) that might be used to produce the P-type region 322 of the base 320 can be eliminated. In some semiconductor processes, an implant process used to produce a P-well region of a low voltage (LV) MOSFET device can also be used to produce a P-type region for the base 320. An example of a P-type well 340 for the base 320 produced using an implant process for a P-well region of a LV MOSFET device (e.g., a 2 to 5 volt LV NMOSFET device) is shown with a dashed line. In other words, the P-well region 340 for the base 320 corresponds with a P-well region of a LV MOSFET device.

However, if the P-well region 340 (which corresponds with a P-well region of an LV MOSFET device) is included in the base 320, a beta ($\beta$) value (e.g., a current gain value) of the BJT device 300 may be less than 10. The P-well region 340 may be deeper and/or may include more total dopant charge than is optimal for the BJT device 300, resulting in the relatively low and undesirable $\beta$ value. In contrast, using an implant process to produce the P-type region 322 of the BJT device 300, which corresponds with a P-type drift region, can result in a relatively high and desirable $\beta$ value between 20 to 200 (e.g., 20, 50, 70, 90, 110, 130, 150, 180).

Figure 4:
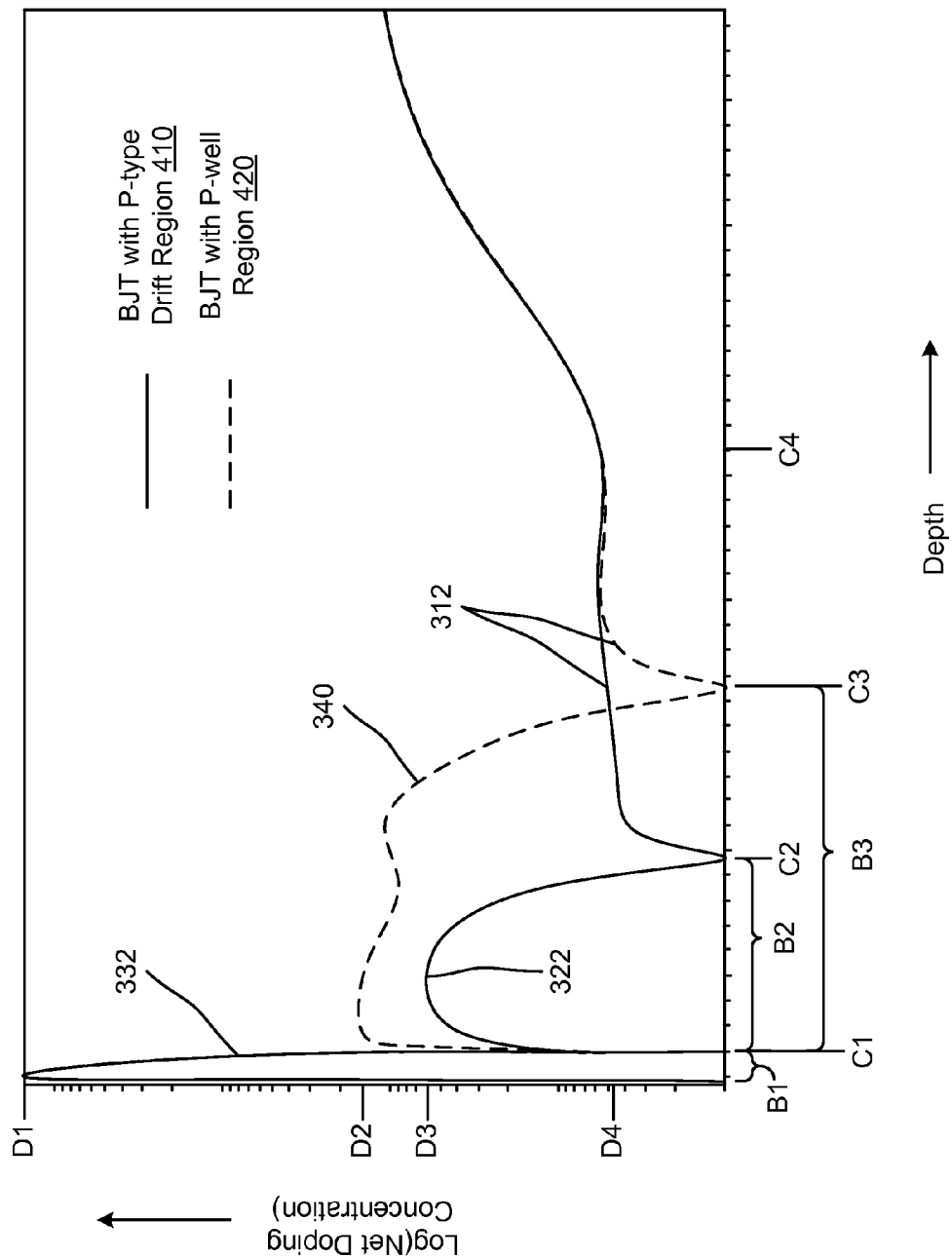
FIG. 4 is a graph that illustrates a comparison of the dopant profiles of the BJT device shown in FIG. 3.

FIG. 4 is a graph that illustrates a comparison of the dopant profiles of the NPN BJT device 300 shown in FIG. 3. Specifically, FIG. 4 illustrates a dopant profile 410 of the BJT device 300 with the P-type drift region 322, and a dopant profile 420 of the BJT device 300 with the P-well region 340. The graph illustrates increasing log of net doping concentration (in absolute value terms) along the y-axis and increasing depth along the x-axis as cut along line A1 shown in FIG. 3.

As shown in the dopant profiles 410, 420 in FIG. 4, the N+ region 332 associated with the emitter 330 of the BJT device 300 has a relatively high doping concentration (at a maximum of approximately D1) and a relatively narrow width B1 to a relatively shallow depth C1. The widths B1 through B3 are considered widths even though vertically oriented or vertically stacked. Accordingly, the widths B1 through B3 will be referred to as vertical widths. The P-type drift region 322 associated with the base 320 of the BJT device 300 (shown in dopant profile 410) has a vertical width B2 to a depth C2, and the N-type region 312 associated with the collector 310 of the BJT device 300 has a relatively large vertical width that starts at depth C2. The maximum doping concentration of the P-type drift region 322 is approximately D3. In contrast, the P-well region 340 associated with the base 320 of the BJT device 300 (shown in dopant profile 420) has a vertical width B3 to a depth C3, and the N-type region 312 associated with the emitter 330 of the BJT device 300 has a relatively large vertical width that starts at depth C3. The maximum doping concentration of the P-well region 340 is approximately D2. The doping concentration of the N-type region 312 is approximately D4 until the doping concentration starts to increase starting at approximately depth C4.

As shown in FIG. 4, the vertical width B2 and depth C2 of the P-type drift region 322 is less than the vertical width B3 and depth C3, respectively, of the P-well region 340. In some embodiments, the vertical width of the P-type drift region 322 can be approximately 1.1 to 3 times less than the vertical width of the P-well region 340. In some embodiments, the vertical width B3 of the P-type drift region 322 can be less than 3 times less than the vertical width B3 of the P-well region 340. Similarly, in some embodiments, the depth C2 of the P-type drift region 322 can be approximately 1.1 to 3 times less than the depth C3 of the P-well region 340. In some embodiments, the depth C2 of the P-type drift region 322 can be less than 3 times less than the depth C3 of the P-well region 340.

In some embodiments, the vertical width B2 of the P-type drift region 322 can be approximately between 0.5 micrometers (μm) to 3 μm. In some embodiments, the vertical width B2 can be less than 0.5 μm or greater than 3 μm. In some embodiments, the depth C2 of the P-type drift region 322 can be approximately between 0.5 μm to 3 μm. In some embodiments, the depth C2 can be less than 0.5 μm or greater than 3 μm.

As shown in FIG. 4, the maximum concentration D3 (and/or average concentration (not shown)) of the P-type drift region 322 is less than the maximum concentration D2 (and/or average concentration (not shown)) of the P-well region 340. In some embodiments, a dopant concentration in a middle portion of the P-type drift region 322 is less than a dopant concentration in a middle portion of the P-well region 340. In some embodiments, the maximum concentration D3 (and/or average concentration (not shown)) of the P-type drift region 322 can be approximately 1.1 to 2 times less than the maximum concentration D2 (and/or average concentration (not shown)) of the P-well region 340. In some embodiments, the maximum concentration D3 (and/or average concentration (not shown)) of the P-type drift region 322 can be less than 2 times less than the maximum concentration D2 (and/or average concentration (not shown)) of the P-well region 340. In some embodiments the maximum concentration D3 (and/or average concentration (not shown)) of the P-type drift region 322 can be approximately between $1 \times 10^{16}$ cm$^{-3}$ to $1 \times 10^{18}$ cm$^{-3}$ (e.g., approximately $1 \times 10^{17}$ cm$^{-3}$). In comparison, the maximum concentration D1 (and/or average concentration (not shown)) of the N+ region 332 associated with the emitter 330 can be approximately an order of magnitude, or more, greater than the maximum concentration D3 (and/or average concentration (not shown)) of the P-type drift region 322. Also, the concentration D4 (and/or average concentration (not shown)) of the N-type region 312 associated with the collector 310 can be approximately an order of magnitude less than the maximum concentration D3 (and/or average concentration (not shown)) of the P-type drift region 322. In some embodiments the maximum concentration D3 (and/or average concentration (not shown)) of the P-type drift region 322 can be less than $1 \times 10^{16}$ cm$^{-3}$ or greater than $1 \times 10^{18}$ cm$^{-3}$. In some embodiments, a BJT device with the P-type drift region 322 and a BJT device with the P-well region 340 can be included in (e.g., produced within) the same device. In some embodiments, the net dopant charge or Gummel number (e.g., the area under the curve) of the P-type drift region 322 can be smaller than the net dopant charge or Gummel number (e.g., the area under the curve) of the P-well region 340.

Figure 5:
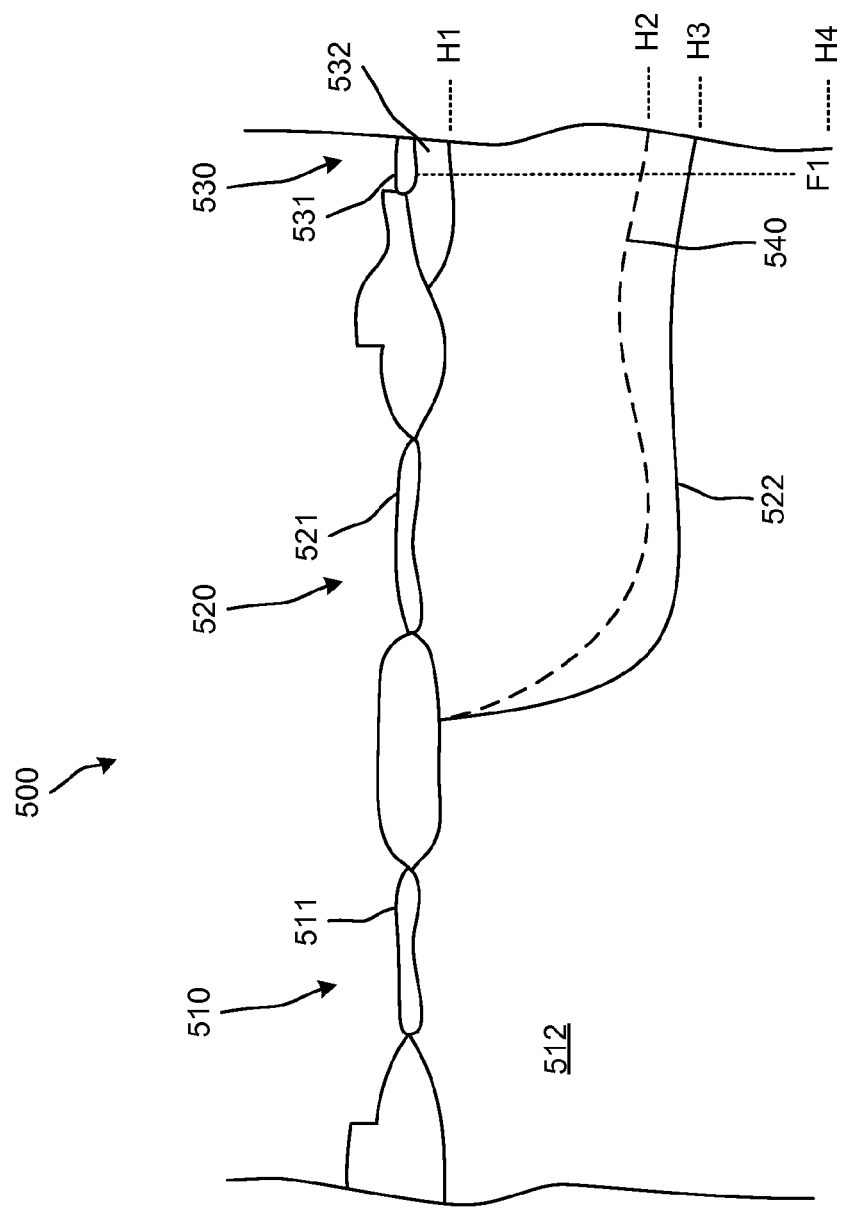
FIG. 5 is a side cross-sectional view of another BJT device, according to an embodiment.

FIG. 5 is a side cross-sectional view of a BJT device 500, according to an embodiment. In this embodiment, the BJT device 500 is a PNP BJT device. The BJT device 500 can be produced using one or more process steps within a semiconductor process that are typically used to produce other types of devices (non-BJT devices) and used, in an unexpected fashion, to produce the BJT device 500.

For example, the BJT device 500 can be produced using one or more process steps within a semiconductor process overlapping or corresponding with process steps (or a process) used to produce a LDMOS device in a BCDMOS process. In such an embodiment where the BJT device 500 is produced within a BCDMOS process, an implant process (e.g., photolithography/masking, etching, implant steps) used to dope a portion of an LDMOS device can be used to dope a portion of the BJT device 500. In other words, an implant process used to dope a portion of an LDMOS device can be the same implant process used to concurrently dope a portion of the BJT device 500.

As shown in FIG. 5, the BJT device 500 includes a collector 510 (also can be referred to as a collector region), a base 520 (also can be referred to as a base region), and an emitter 530 (also can be referred to as an emitter region). The collector 510 includes silicide portion 511, the base 520 includes silicide portion 521, and the emitter 530 includes silicide portion 531. The silicide portions 511, 521, and 531 can be associated with a silicide layer.

The collector 510 and the emitter 530 are doped with a P-type dopant, and the base 520 is doped with an N-type dopant. Specifically, the collector 510 includes a P-type region 512 (which can be referred to as a collector implant region) that is a lightly doped P-type region (e.g., a P− buried region (or layer)), and the emitter 530 includes a P-type region 532 (which can be referred to as an emitter implant region) that is a heavily doped P-type region (also can be referred to as a P+ region (or implant)). An implant process that is used to produce an N-type drift region for an LNDMOS device (not shown) is also used to concurrently form the N-type region 522 of the base 520 (which can be referred to as a base implant region). Accordingly, the N-type region 522 of the base 520 is an N-type drift region that corresponds with an N-type drift region of an LNDMOS device. In some embodiments, the N-type region 522 of the base 520 corresponds with an N-type drift region of an HV LNDMOS device. In some embodiments, the P-type region 512 can include one or more different types of P-type regions (or implants) including a P-type substrate, a P-type buried region, a P-type sinker region, an P-type connector region, and/or so forth. These different P-type regions can have different dopant concentrations.

By using one or more process steps that are typically used to produce a N-type drift region of an LNDMOS device, dedicated process (or process step) that might be used to produce the N-type region 522 of the base 520 can be eliminated. In some semiconductor processes, an implant process used to produce a N-well region of a low voltage (LV) MOSFET device can also be used to produce a N-type region for the base 520. An example of a N-well region 540 for the base 520 produced using an implant process for an N-well region of a LV MOSFET device (e.g., a 2 to 5 volt LV PMOSFET device) is shown with a dashed line. In other words, the N-well region 540 for the base 520 corresponds with an N-well region of a LV MOSFET device.

However, if the N-well region 540 (which corresponds with an N-well region of a LV MOSFET device) is included in the base 520, a beta (β) value (e.g., a current gain) of the BJT device 500 may be less than 10. The N-well region 540 may be shallower and/or may include more total dopant charge than is optimal for the BJT device 500, resulting in the relatively low and undesirable β value. In contrast, using an implant process to produce the N-type region 522 of the BJT device 500, which corresponds with an N-type drift region, can result in a relatively high and desirable (3 value between 20 to 100 (e.g., 20, 50, 70, 90).

Figure 6A:
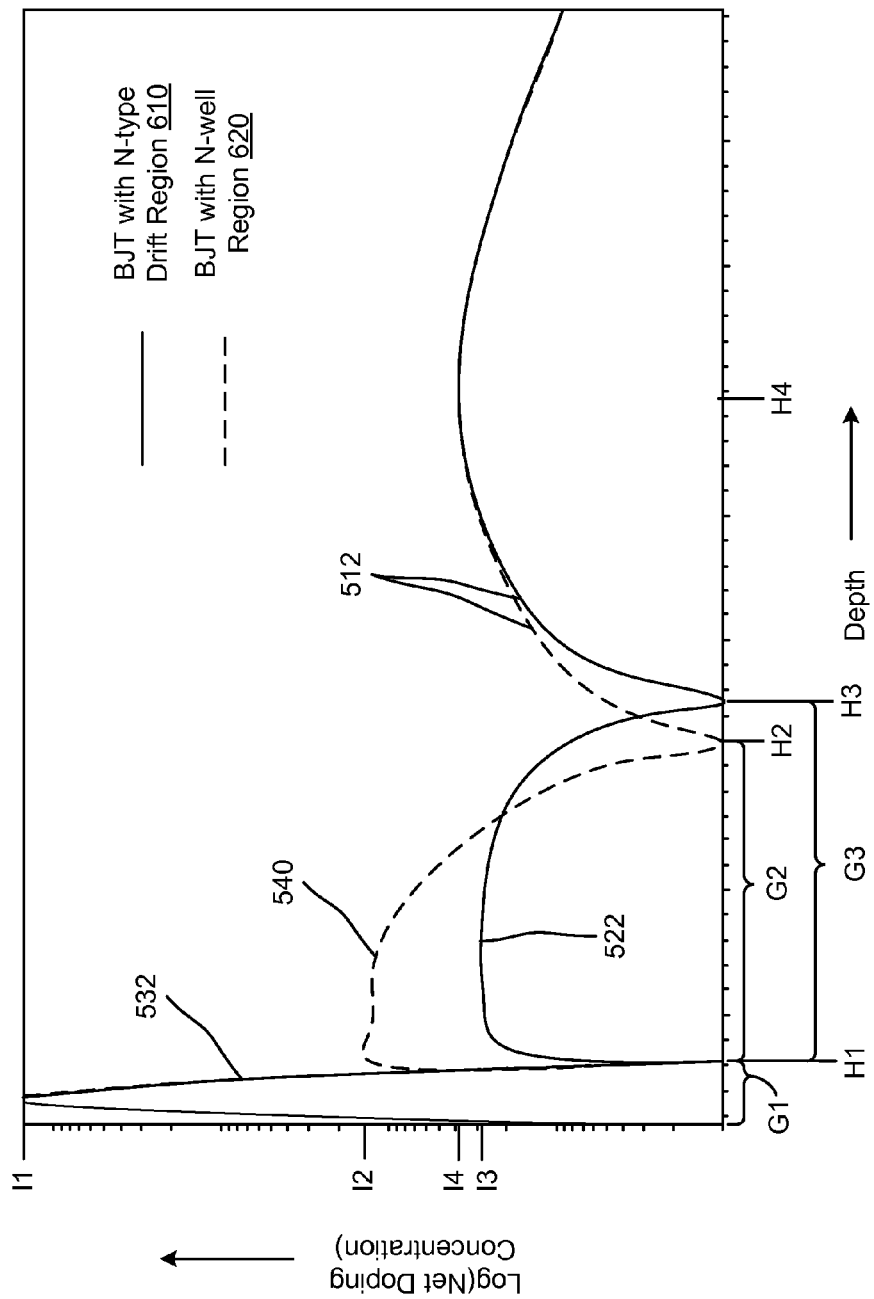
FIG. 6A is a graph that illustrates a comparison of the dopant profiles of the BJT device shown in FIG. 5.

FIG. 6A is a graph that illustrates a comparison of the dopant profiles of the PNP BJT device 500 shown in FIG. 5. Specifically, FIG. 6A illustrates a dopant profile 610 of the BJT device 500 with the N-type drift region 522, and a dopant profile 620 of the BJT device 500 with the N-well region 540. The graph illustrates increasing log of net doping concentration (in absolute value terms) along the y-axis and increasing depth along the x-axis as cut along line F1 shown in FIG. 5.

As shown in the dopant profiles 610, 620 in FIG. 6A, the P+ region 532 associated with the emitter 530 of the BJT device 500 has a relatively high doping concentration (at a maximum of approximately I1) and a relatively narrow vertical width G1 to a relatively shallow depth H1. The vertical widths G1 through G3 are considered vertical widths even though vertically oriented or vertically stacked. Accordingly, the widths G1 through G3 will be referred to as vertical widths. The N-type drift region 522 associated with the base 520 of the BJT device 500 (shown in dopant profile 610) has a vertical width G3 to a depth H3, and the N-type region 512 associated with the collector 510 of the BJT device 500 has a relatively large vertical width that starts at depth H3. The maximum doping concentration of the N-type drift region 522 is approximately I3. In contrast, the N-well region 540 associated with the base 520 of the BJT device 500 (shown in dopant profile 620) has a vertical width G2 to a depth H2, and the N-type region 512 associated with the emitter 530 of the BJT device 500 has a relatively large vertical width that starts at depth H2. The maximum doping concentration of the N-well region 540 is approximately I2. The maximum doping concentration of the N-type region 512 is approximately I4 at approximately depth H4.

Figure 6B:
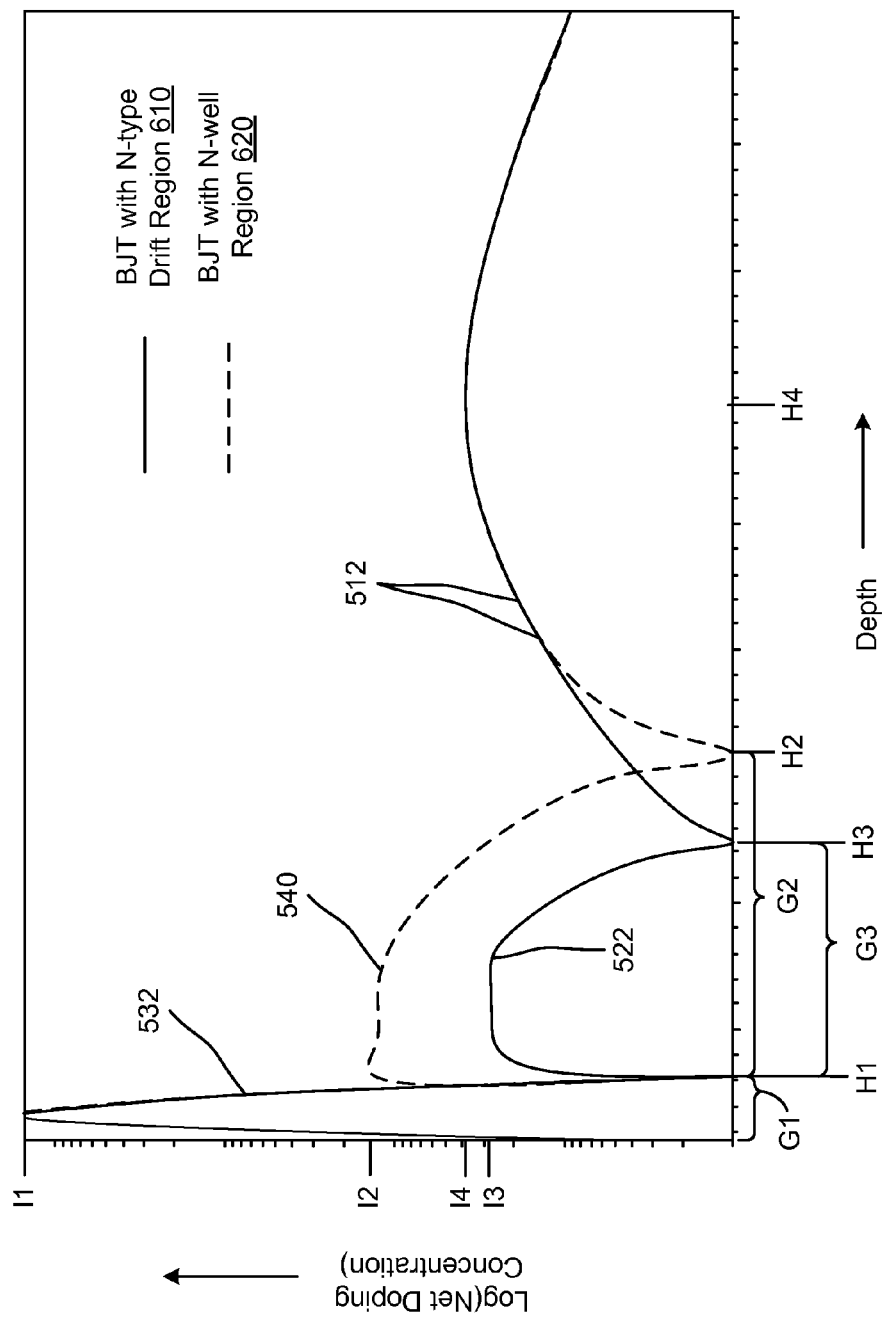
FIG. 6B is another graph that illustrates comparisons of dopant profiles of a BJT device similar to that shown in FIG. 5.

As shown in FIG. 6A, the vertical width G3 and depth H3 of the N-type drift region 522 is greater than the vertical width G2 and depth H2, respectively, of the N-well region 540. FIG. 6B is another graph that illustrates comparisons of dopant profiles of a BJT device similar to that shown in FIG. 5. In the embodiment shown in FIG. 6B, the vertical width G3 and depth H3 of the N-type drift region 522 in FIG. 6B is less than the vertical width G2 and depth H2, respectively, of the N-well region 540. In some embodiments, the vertical width G3 of the N-type drift region 522 can be approximately 1.1 to 2 times less than the vertical width G2 of the N-well region 540. In some embodiments, the vertical width G3 of the N-type drift region 522 can be less than 2 times less than the vertical width G2 of the N-well region 540. Similarly, in some embodiments, the depth H3 of the N-type drift region 522 can be approximately 1.1 to 2 times less than the depth H2 of the N-well region 540. In some embodiments, the depth H3 of the N-type drift region 522 can be less than 2 times less than the depth H2 of the N-well region 540.

In some embodiments, the vertical width G3 of the N-type drift region 522 (in FIGS. 6A and/or 6B) can be approximately between 0.5 micrometers (μm) to 3 μm. In some embodiments, the vertical width G3 can be less than 0.5 μm or greater than 3 μm. In some embodiments, the depth H3 of the N-type drift region 522 can be approximately between 0.5 μm to 3 μm. In some embodiments, the depth H3 can be less than 0.5 μm or greater than 3 μm.

Referring back to FIG. 6A, the maximum concentration I3 (and/or average concentration (not shown)) of the N-type drift region 522 is less than the maximum concentration I2 (and/or average concentration (not shown)) of the N-well region 540. In some embodiments, a dopant concentration in a middle portion of the N-type drift region 522 is less than a dopant concentration in a middle portion of the N-well region 540. In some embodiments, the maximum concentration I3 (and/or average concentration (not shown)) of the N-type drift region 522 can be approximately 1.1 to 2 times less than the maximum concentration I2 (and/or average concentration (not shown)) of the N-well region 540. In some embodiments, the maximum concentration I3 (and/or average concentration (not shown)) of the N-type drift region 522 can be less than 2 times less than the maximum concentration I2 (and/or average concentration (not shown)) of the N-well region 540. In some embodiments the maximum concentration I3 (and/or average concentration (not shown)) of the N-type drift region 522 can be approximately between $1\times10^{15}$ cm$^{-3}$ to $1\times10^{17}$ cm$^{-3}$ (e.g., approximately $1\times10^{16}$ cm$^{-3}$). In comparison, the maximum concentration I1 (and/or average concentration (not shown)) of the P+ region 532 associated with the emitter 530 can be approximately an order of magnitude, or more, greater than the maximum concentration I3 (and/or average concentration (not shown)) of the N-type drift region 522. Also, the maximum concentration I4 (and/or average concentration (not shown)) of the N-type region 512 associated with the collector 510 can be approximately the same as or an order of magnitude less than the maximum concentration I3 (and/or average concentration (not shown)) of the N-type drift region 522. In some embodiments the maximum concentration I3 (and/or average concentration (not shown)) of the N-type drift region 522 can be less than $1\times10^{16}$ cm$^{-3}$ or greater than $1\times10^{18}$ cm$^{-3}$. In some embodiments, a BJT device with the N-type drift region 522 and a BJT device with the N-well region 540 can be included in (e.g., produced within) the same device. In some embodiments, the net dopant charge or Gummel number (e.g., the area under the curve) of the N-type drift region 522 (in FIGS. 6A and/or 6B) can be smaller than the net dopant charge or Gummel number (e.g., the area under the curve) of the N-well region 540.

Figure 7A:
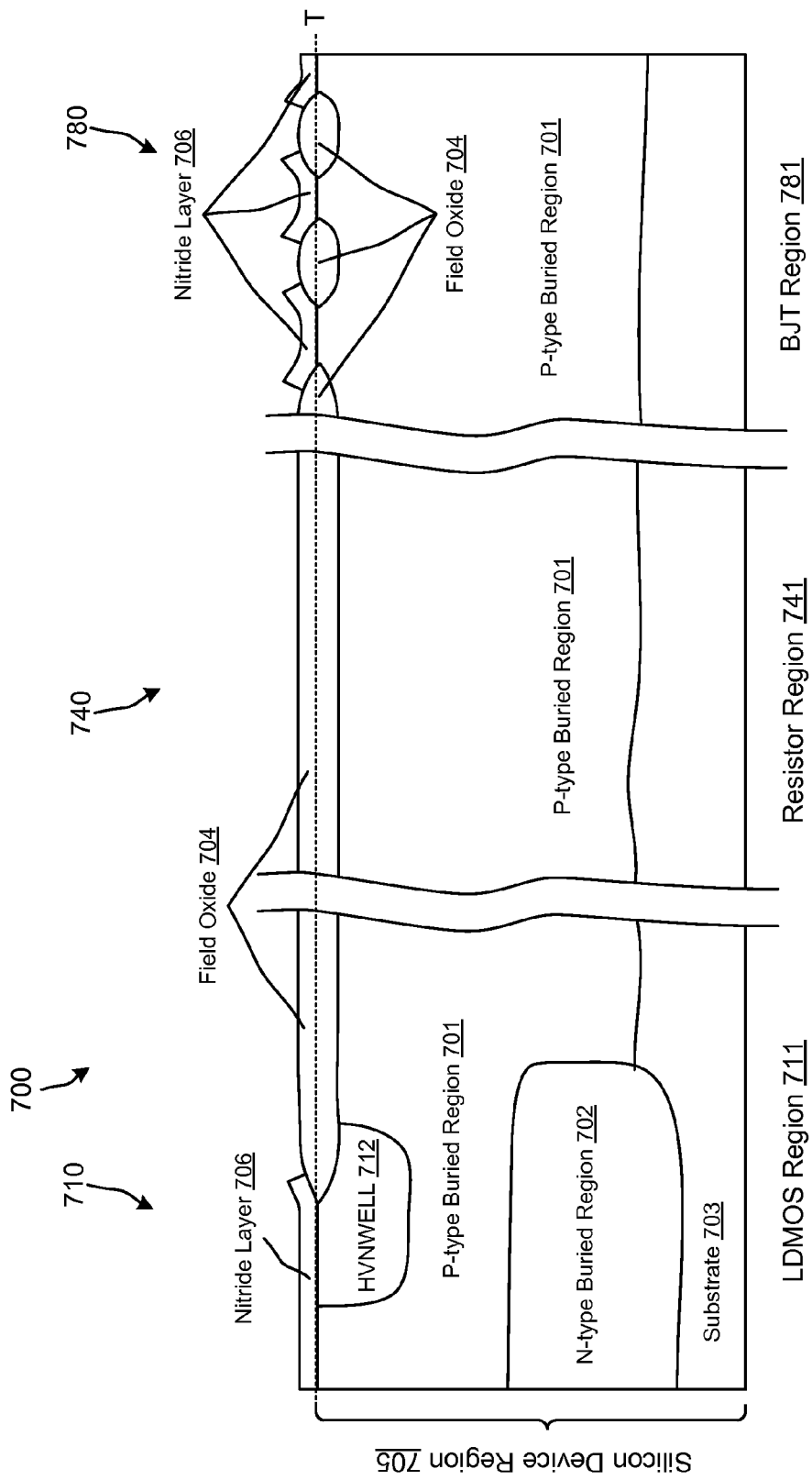
FIGS. 7A through 7M are diagrams that illustrate cross-sectional views of at least some process steps in a semiconductor process.
Figure 7B:
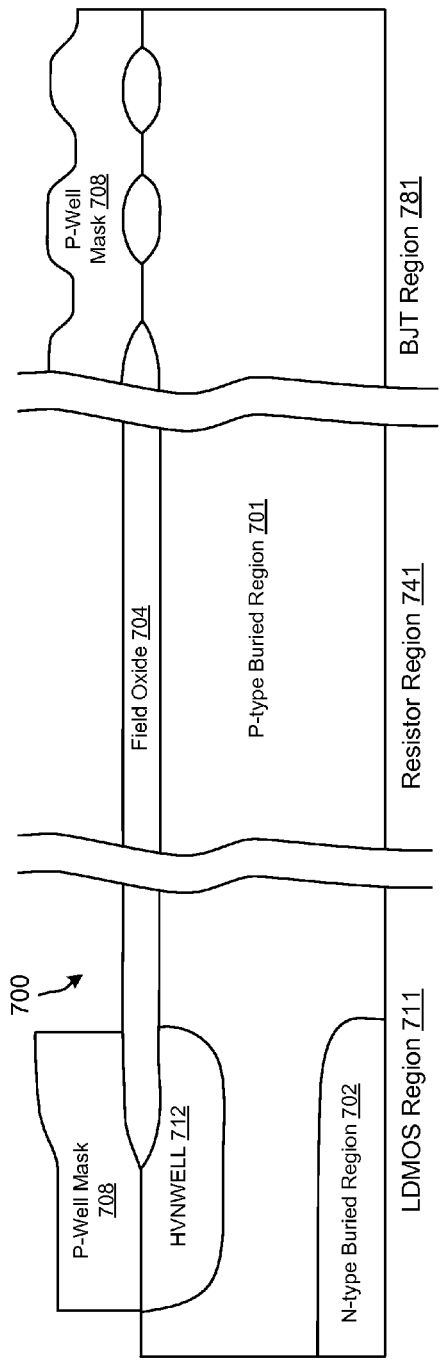
Figure 7C:
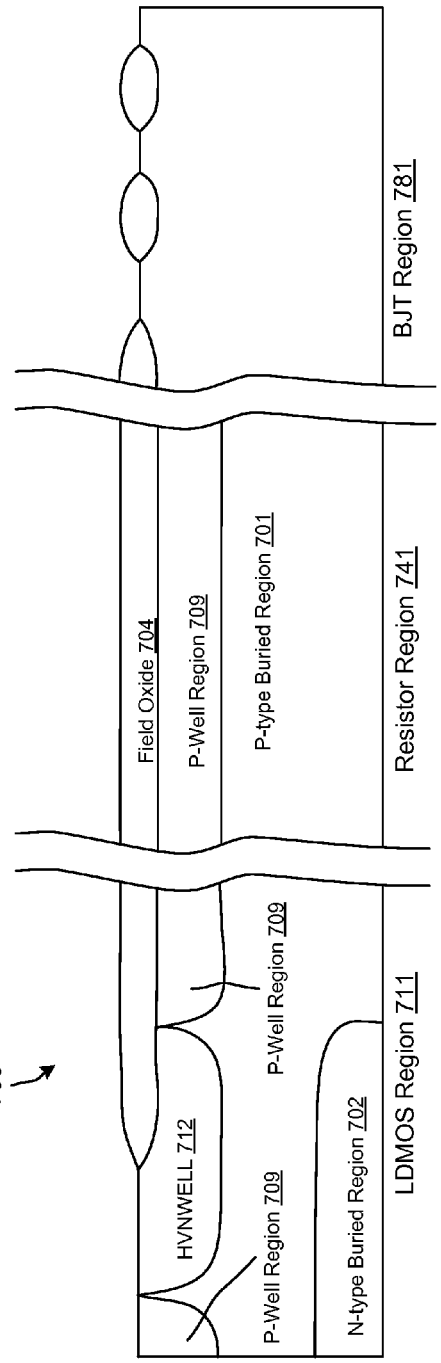
Figure 7D:
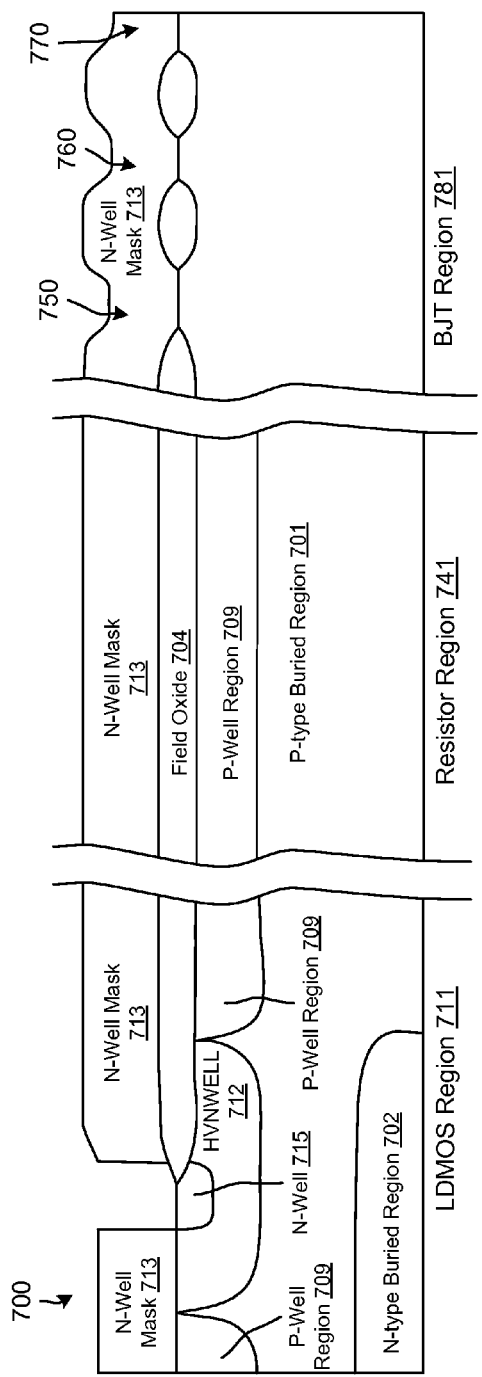
Figure 7E:
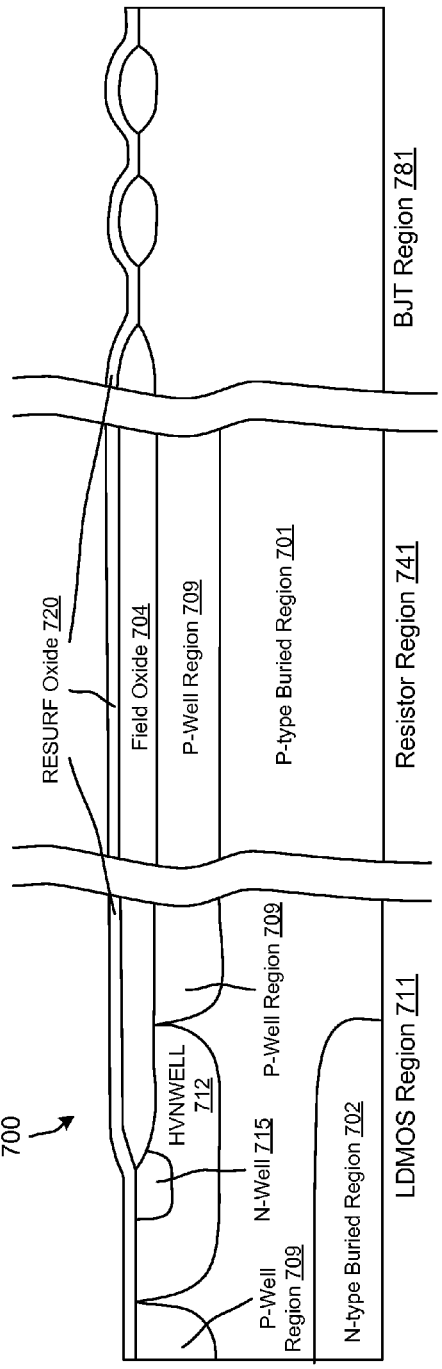
Figure 7F:
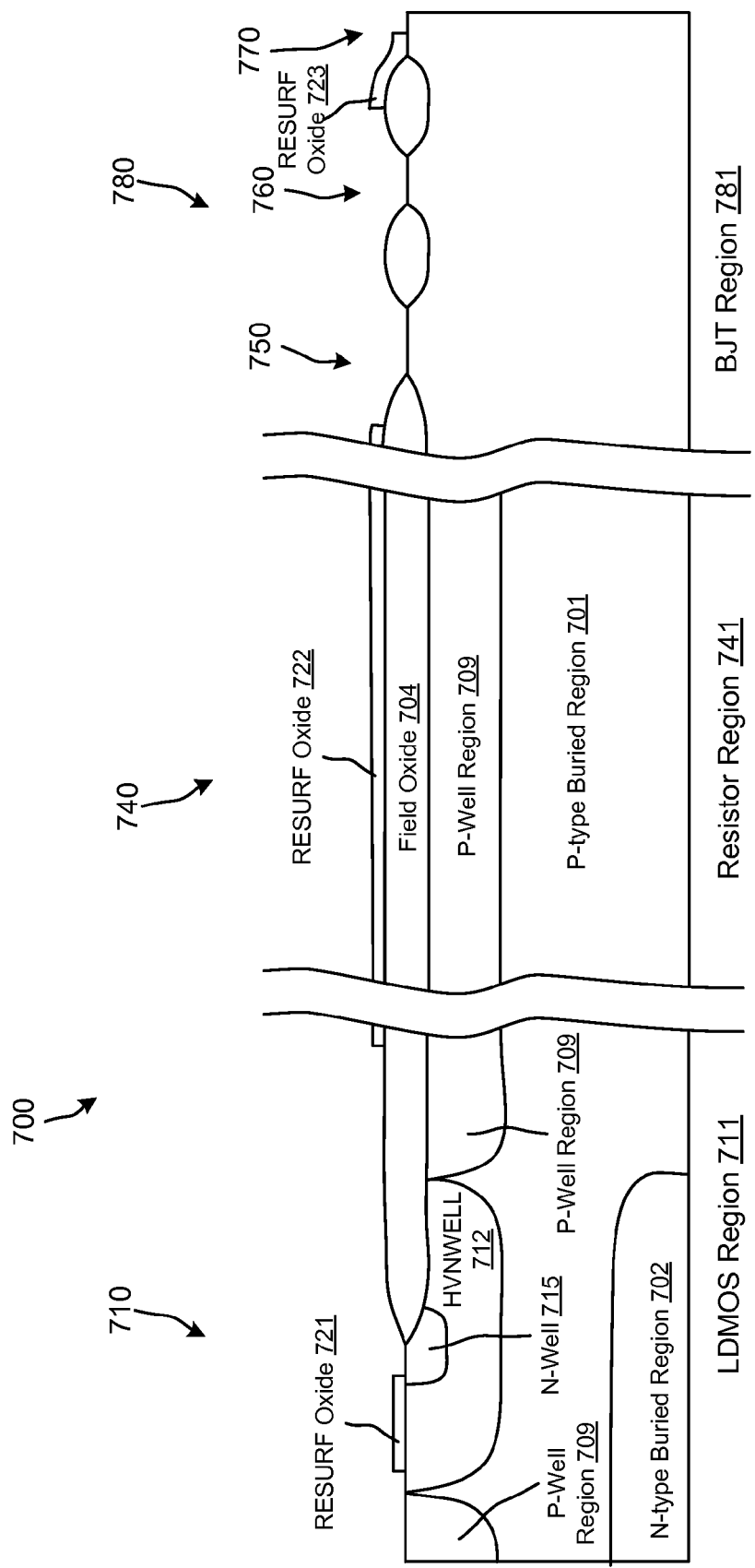
Figure 7G:
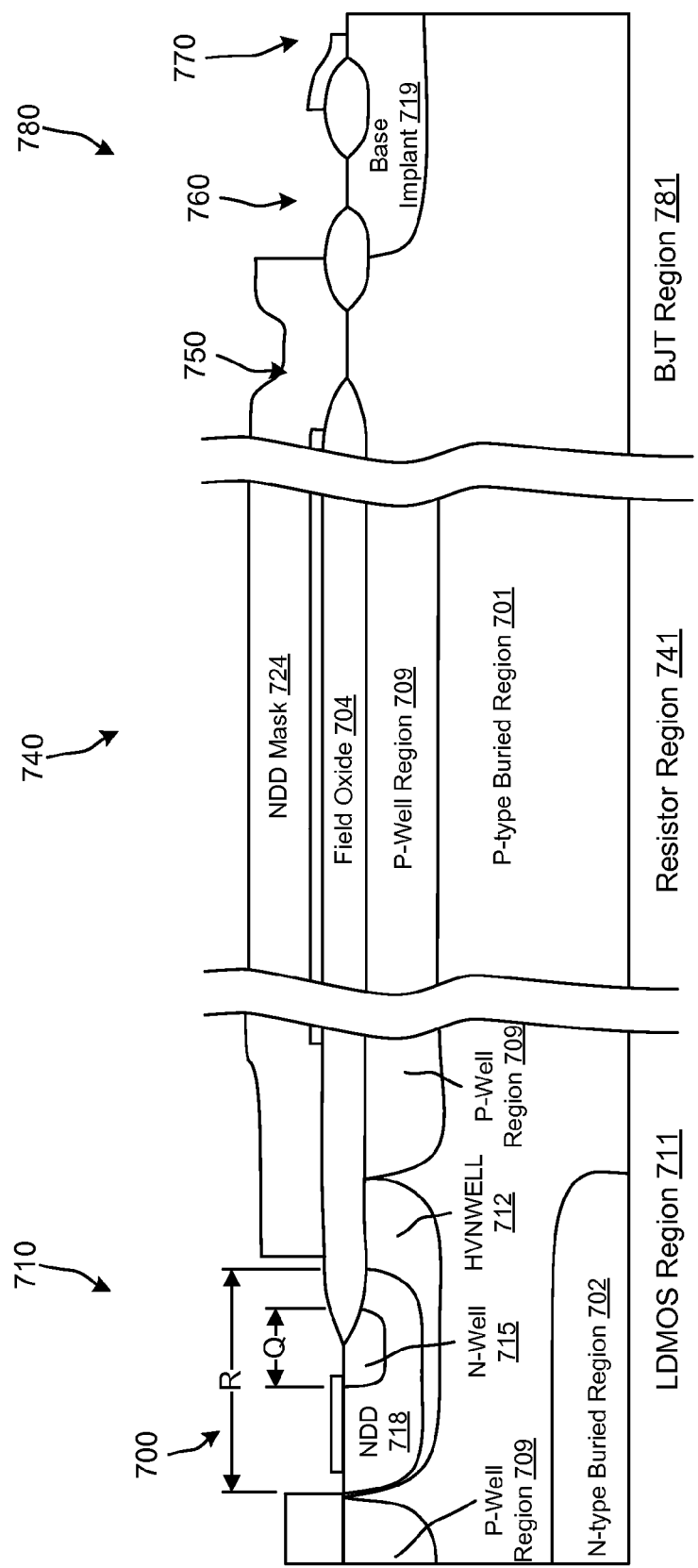
Figure 7H:
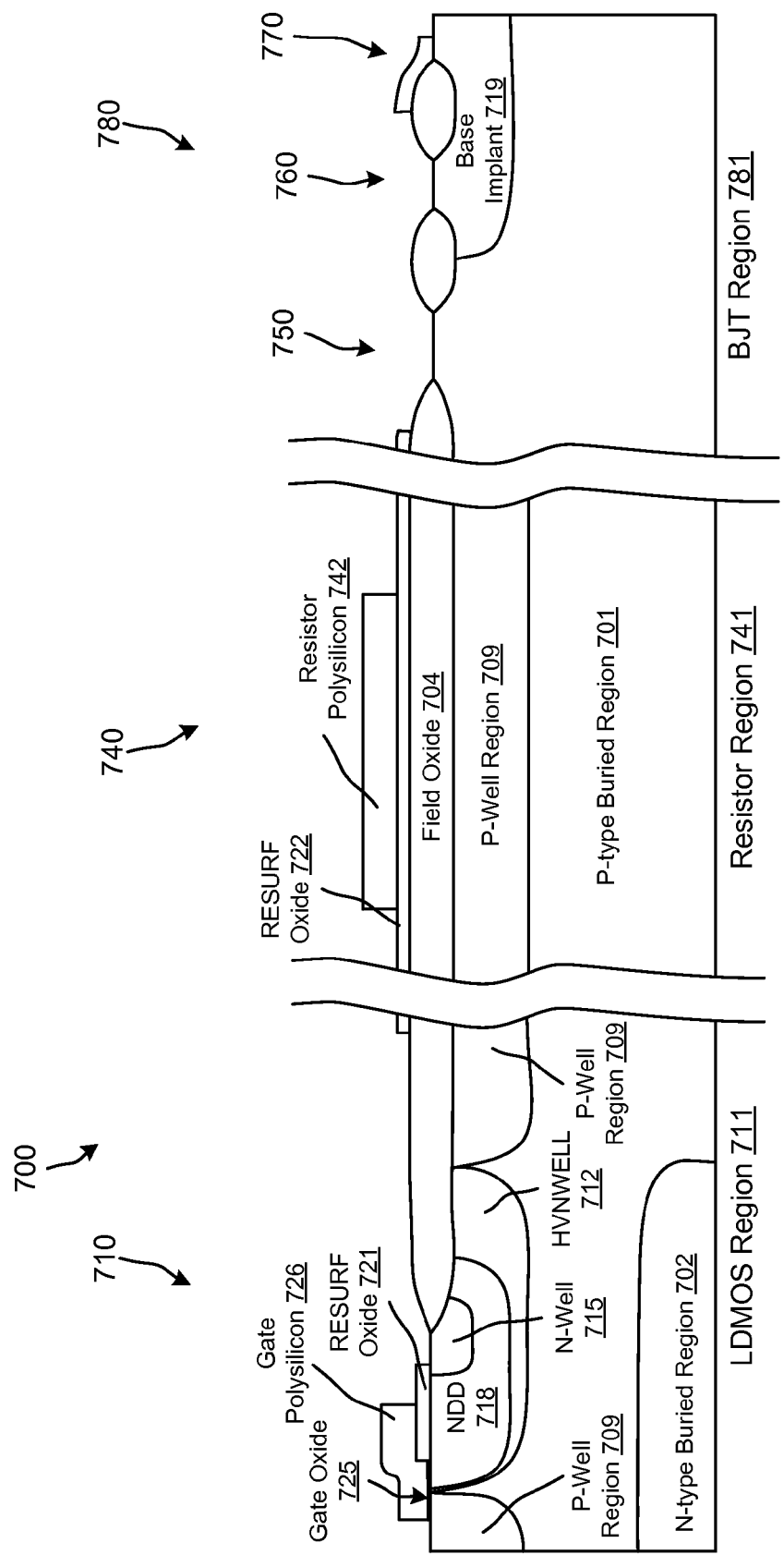
Figure 7I:
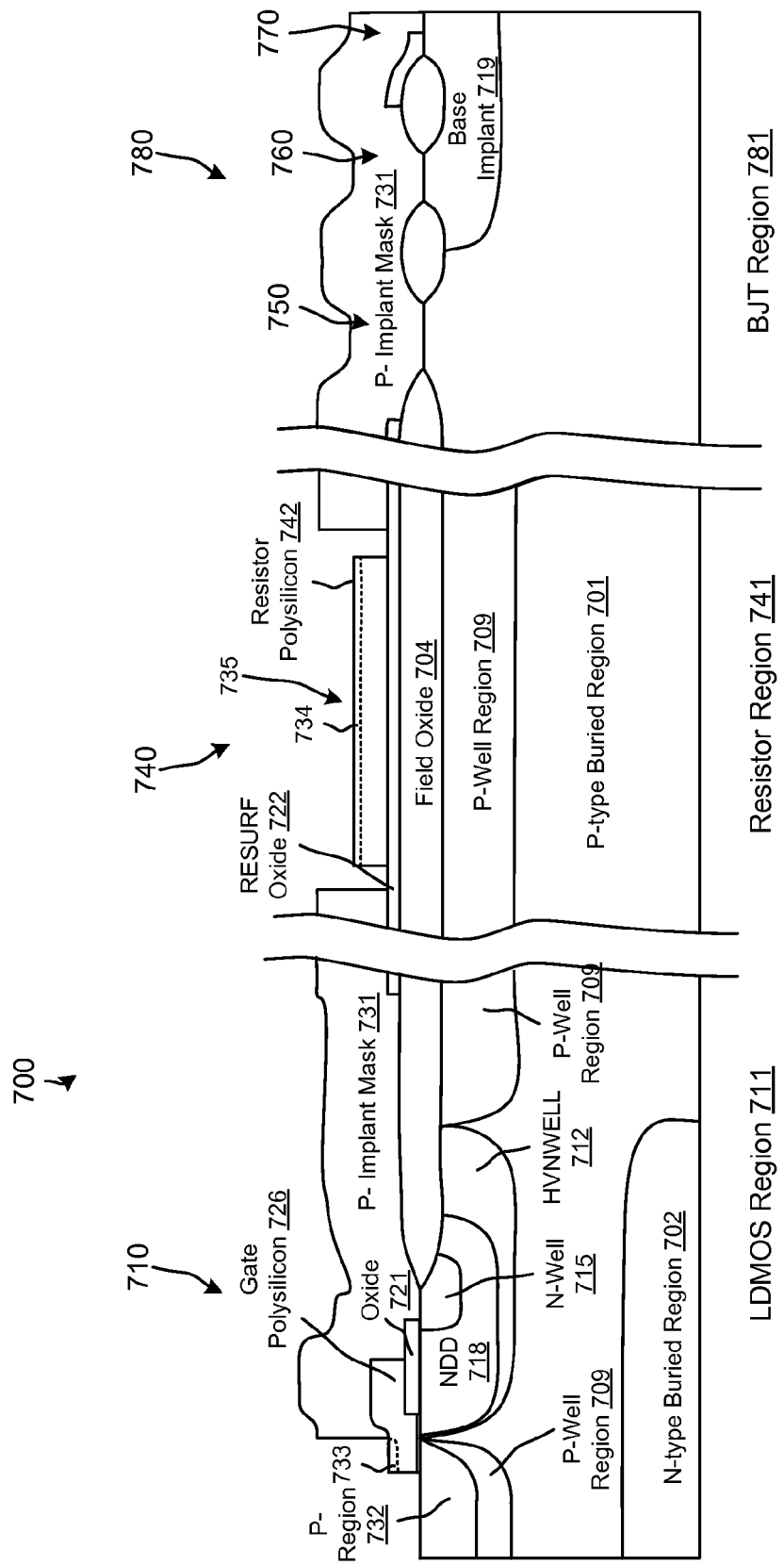
Figure 7J:
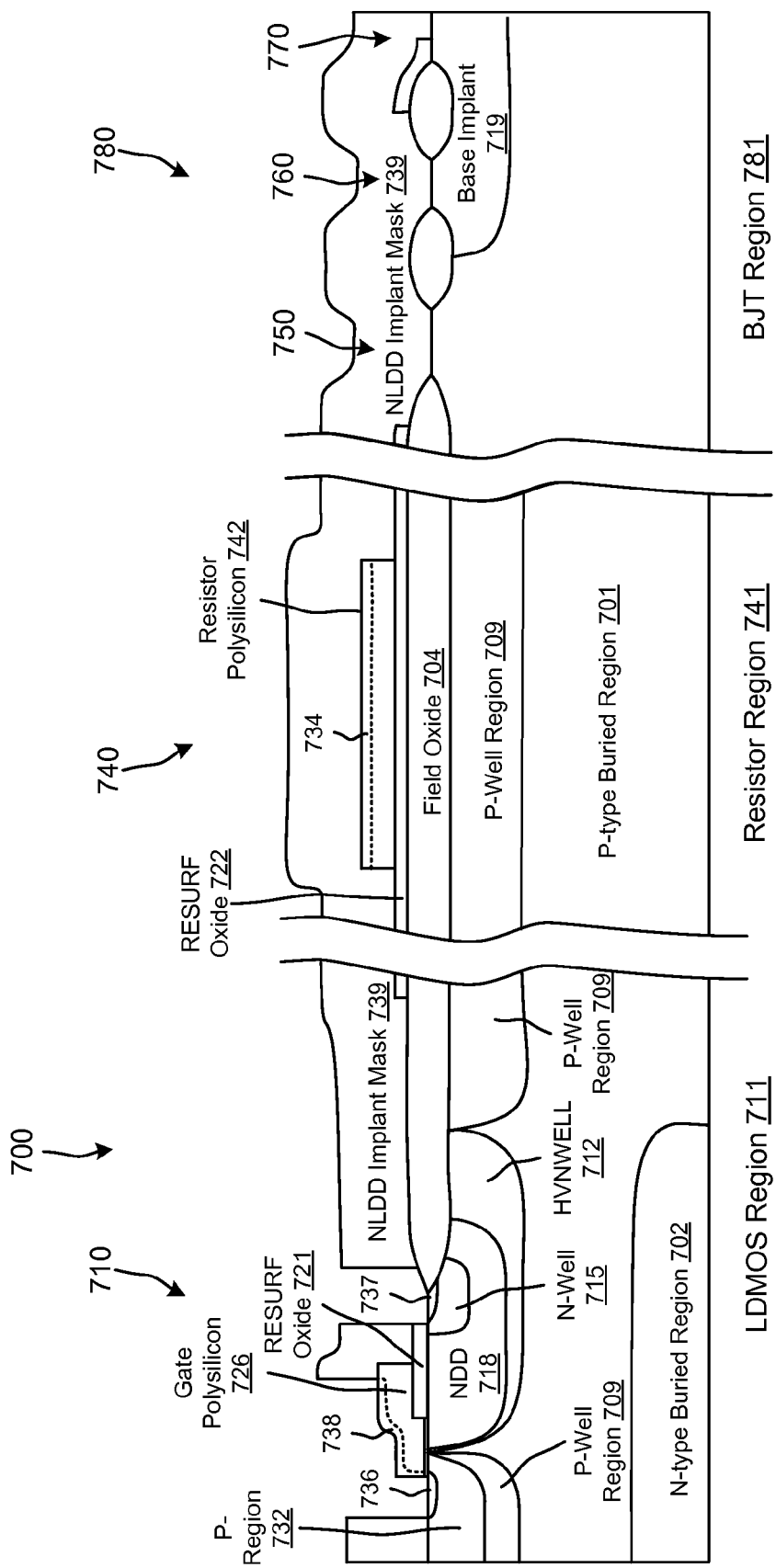
Figure 7K:
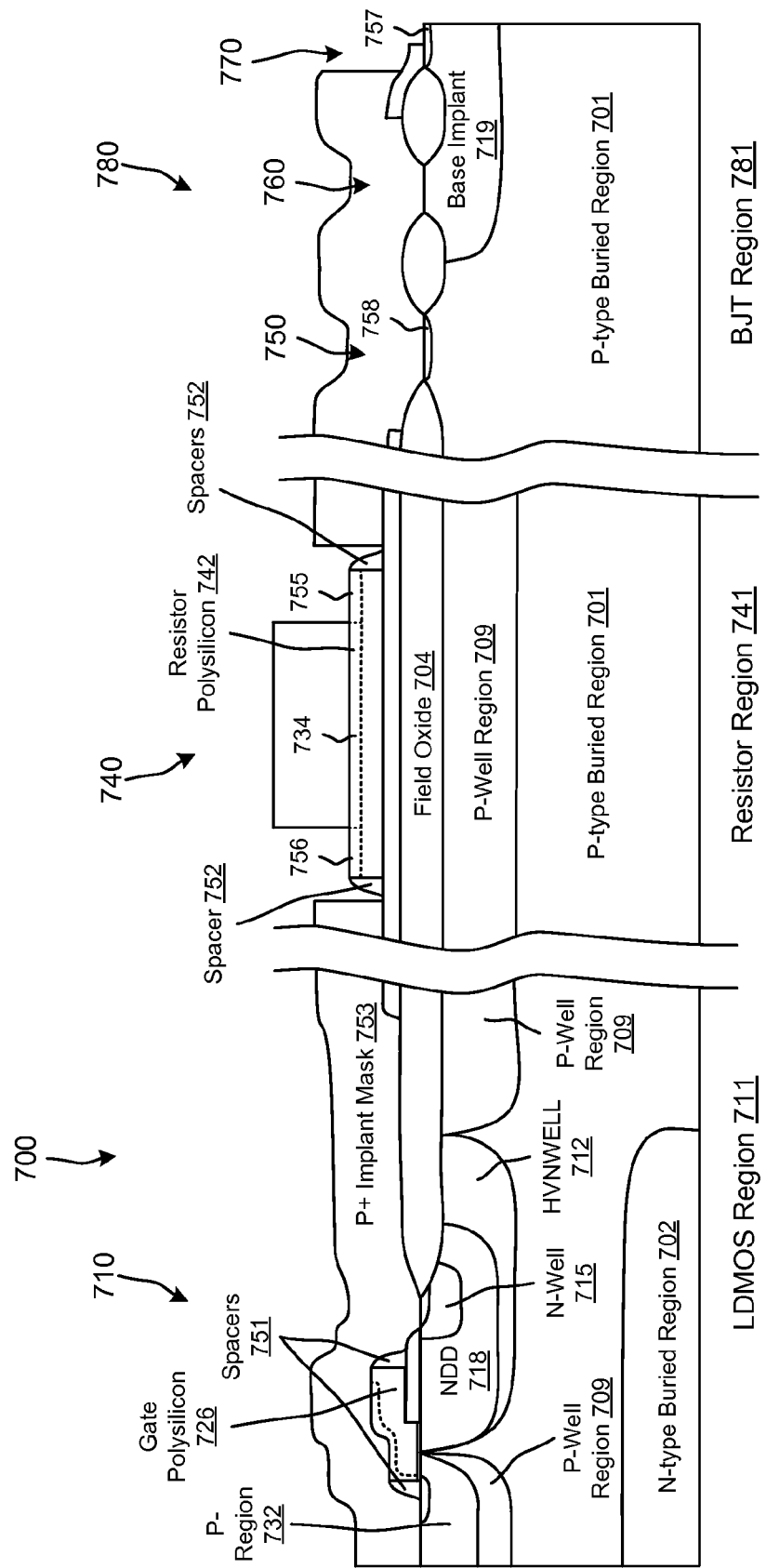
Figure 7L:
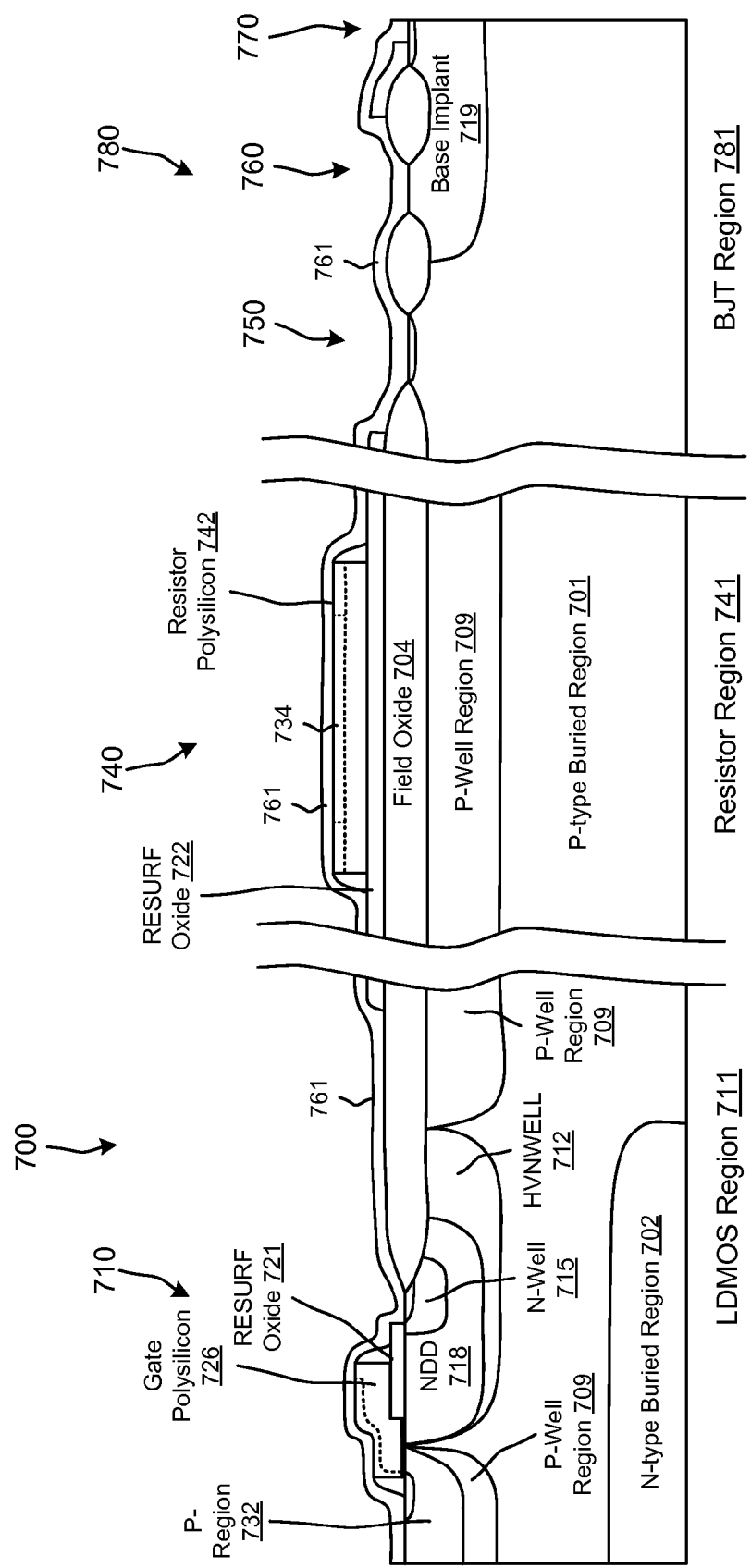
Figure 7M:
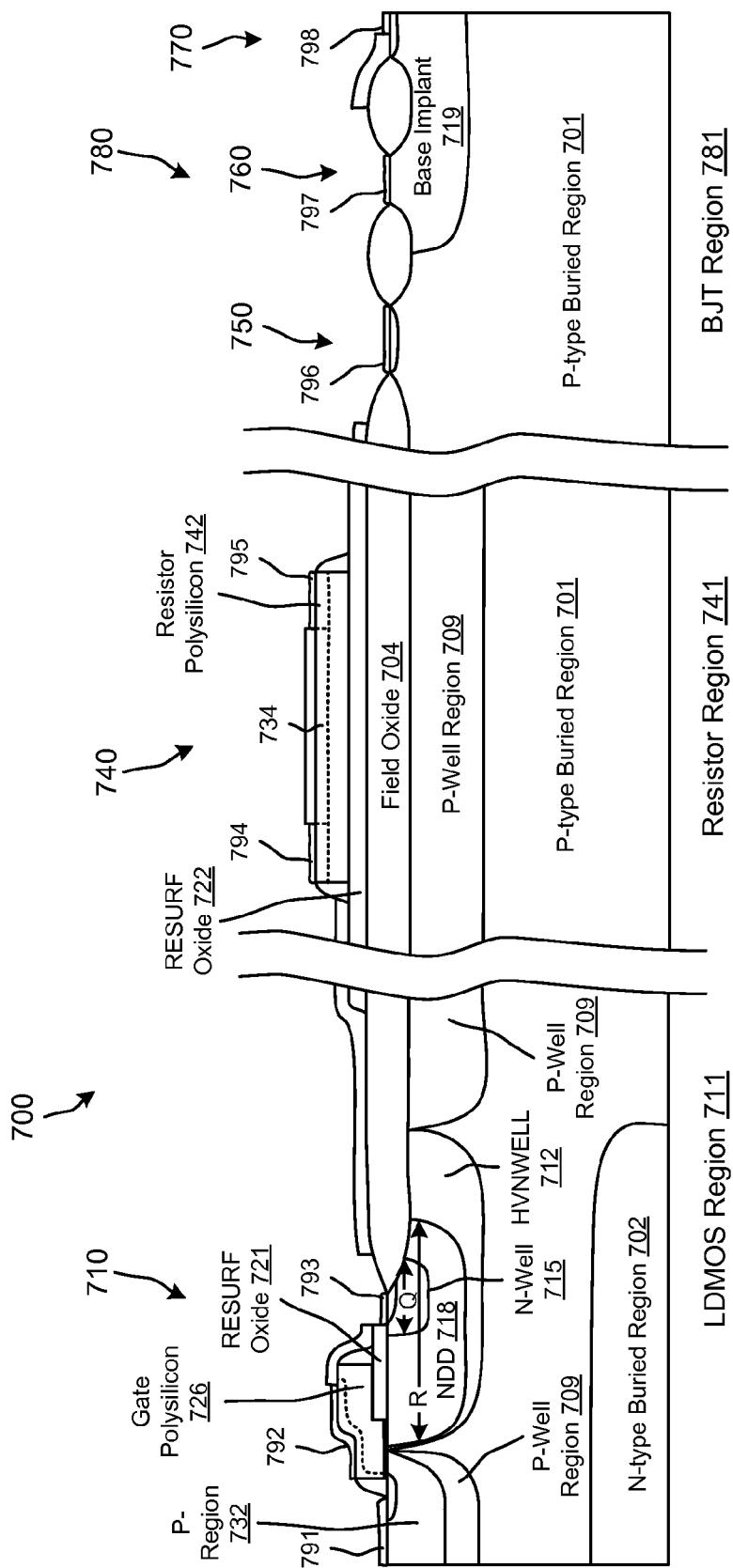

FIGS. 7A through 7M are diagrams that illustrate cross-sectional views of at least some process steps in a semiconductor process that can be used to produce an LDMOS device 710 (e.g., a HV LDMOS device, an LNDMOS device), a polysilicon resistor 740, and/or a BJT device 780 (each shown as devices in FIG. 7M). Specifically, in this embodiment, portions of the polysilicon resistor 740 and/or the BJT device 780 can be produced using one or more process steps within a semiconductor process overlapping or corresponding with one or more process steps used to produce the LDMOS device 710. The LDMOS device 710, the polysilicon resistor 740, and the BJT device 780 are integrated in a device 700 (also can be referred to as an integrated circuit). The LDMOS device 710 is produced within an LDMOS region 711 of the device 700, the polysilicon resistor 740 is produced within a resistor region 741 of the device 700, and the BJT device 780 is produced within a BJT region 781 of device 700. As shown in FIG. 7M, the BJT device 780 includes a collector 750, a base 760, and an emitter 770.

Although FIGS. 7A through 7M are cross-sectional diagrams that illustrate process steps in a BCDMOS process, the techniques described herein can be applied in a variety of semiconductor processes. The sequence of process steps depicted by the cross-sectional views shown in FIGS. 7A through 7M are exemplary. Accordingly, various process steps are simplified and/or intermediate process steps are not shown. In some embodiments, at least some of the process steps described herein can be performed in a different order than shown. Also, not all of the elements will be re-labeled with references numerals in each of the figures to simplify the figures. In some embodiments, the oxides described herein can include, or can be, any combination of dielectrics including a low-k dielectric, a silicon dioxide, a thermally grown oxide, a deposited oxide, and/or so forth.

As shown in FIG. 7A, the device 700 includes a substrate 703 and an N-type buried region 702 disposed between the substrate 703 and a P-type buried region 701 in the LDMOS region 711. The P-type buried region 701 and the N-type buried region 702 can be formed using a series of process steps including implantation process steps, oxidation process steps epitaxial growth steps, and/or so forth. In some embodiments, at least a portion of the N-type buried region 702 and the P-type buried region 701 can be formed in one or more epitaxial layers (e.g., P-type epitaxial layers) that are serially formed (e.g., formed in a stack fashion, formed above one another during different time periods with intervening process steps or layers). For example, a first P-type epitaxial layer can be formed on the substrate 703 and a second P-type epitaxial layer can be formed on the first P-type epitaxial layer. The epitaxial layers can have thicknesses between approximately 0.5 µm to 3 µm. In some embodiments, one or more of the epitaxial layers can have a thickness less than approximately 0.5 µm or greater than approximately 6 µm. In some embodiments, the epitaxial layers can have different thicknesses.

The epitaxial layer(s), if formed on the substrate 703, and the substrate 703 can collectively be referred to as a silicon device region 705. A top surface T of the silicon device region 705 is illustrated with a dashed line in FIG. 7A. The top surface T of the silicon device region 705 can be a substantially planar top surface T that is horizontally aligned, and a vertical direction can be substantially normal to the top surface T. Although the top surface T and the silicon device region 705 may not be shown in each of the figures, these features are referred to in the subsequent figures.

As shown in FIG. 7A, a high voltage N-well (HVNWELL) region 712 is formed in the P-type buried region 701. In some embodiments, the HVNWELL region 712 can be formed using an HVNWELL photolithography process and an N-type implant process (e.g., an HVNWELL implantation process).

If two epitaxial layers are formed on the substrate 703 with a first epitaxial layer disposed between a second epitaxial layer and the substrate 703, the HVNWELL region 712 can have a depth approximately equal to a depth of the second epitaxial layer, which is disposed on the first epitaxial layer. In some embodiments, the HVNWELL region 712 can have a depth that is less than the depth of the second epitaxial layer, or can have a depth that exceeds the depth of the second epitaxial layer so that at least a portion of the HVNWELL region 712 is disposed in the first epitaxial layer. In some embodiments, at least a portion of the HVNWELL region 712 can be disposed in the substrate 730.

In this embodiment, after the HVNWELL region 712 has been formed, a nitride layer 706 is formed. Portions of the nitride layer 706 are formed in the LDMOS region 711 and portions of the nitride layer 706 are formed in the BJT region 781 (e.g., portions between collector, base, and emitter). The nitride layer 706, in some embodiments, can be a deposited layer, and can be formed using a variety of processing steps including photolithography process steps, etching steps, and/or so forth.

After the nitride layer 706 has been formed, a field oxide 704 is formed. The field oxide 704 can have portions that are in contact with, or disposed below, at least some of the portions of the nitride layer 706. As shown in FIG. 7A, at least a portion of the field oxide 704 can be disposed above the top surface T of the silicon device region 705 and at least a portion of the field oxide 704 can be disposed below the top surface T of the silicon device region 705. In some embodiments, the field oxide 704 can be formed as a local oxidation of silicon (LOCOS) using a LOCOS process. In some embodiments, the field oxide 704 can have a thickness of between 2000 (Angstroms) Å and 7000 Å (e.g., 3000 Å, 4500 Å, 5000 Å).

Although not shown in FIG. 7A, in some embodiments, a buffer oxidation, a pad oxidation, sacrificial oxidations and/or so forth can be performed.

FIG. 7B is a cross-sectional diagram illustrating the device 700 after the nitride layer 706 has been removed. After the nitride layer 706 is been removed, a P-well mask 708 (or portions thereof) can be formed on at least some portions of the device 700. Portions of the device 700 that are unmasked with (or exposed through) the P-well mask 708 will be doped with a P-type dopant to form one or more P-well regions 709, which are shown in FIG. 7C. As shown in FIG. 7B, the P-well mask 708 is formed over at least some portions of the LDMOS region 711 and over at least some portions of the BJT region 781. The P-well regions 709 can be formed using a P-well implant in addition to other types of implants including an anti-punch through (APT) implant, an N-type threshold voltage adjust (NVT) implant, a deep isolation implant, and/or so forth. Throughout this description a mask can be, or can include, a photoresist.

As shown in FIG. 7C, several of the P-well regions 709 are formed in the LDMOS region 711 lateral to the HVNWELL region 712 so that the HVNWELL region 712 is disposed between P-well regions 709 (e.g., disposed between two P-well region 709). Also, as shown in FIG. 7C, the P-well region 709 (e.g., another portion of the P-well region 709) is formed below the field oxide 704 and the resistor region 741. Accordingly, the P-well region 709 has at least a portion disposed between the field oxide 704 and the P-type buried region 701 in the resistor region 741. Although not shown in FIG. 7B, in some embodiments, at least some portions of the P-well mask 708 may be formed on at least some portions of the resistor region 741 so that at least some portions of the P-well region 709 may not be formed below the field oxide 704. In some embodiments, a different type of P-type region can be formed within the P-type buried region 701 of the resistor region 741.

In some embodiments, the P-well implant process used to form the P-well region 709 can be used to form a P-well region in a base of a BJT device (not shown) (e.g., a NPN BJT device). In this embodiment, the P-well implant process used to form the P-well region 709 is not used to form the base 760 of the BJT device 780. In some embodiments, the P-well doping or implant process can be used to form at least a portion of the BJT device 780.

FIG. 7D is a cross-sectional diagram illustrating formation of an N-well mask 713 (or portions thereof) on at least some portions of the device 700. Portions of the device 700 (e.g., the LDMOS region 711) that are unmasked with (or exposed through) the N-well mask 713 will be doped with an N-type dopant to form one or more N-well regions 715. In this embodiment, an N-well region 715 is formed within the HVNWELL region 712 of the LDMOS region 711. The N-well region(s) 715 can be formed using an N-well implant in addition to other types of implants including an APT implant, a P-type threshold voltage adjust (PVT) implant, and/or so forth.

In some embodiments, the N-well implant process used to form the N-well region 715 can be used to form an N-well region in a base of a BJT device (not shown) (e.g., a PNP BJT device). In this embodiment, the N-well implant process used to form the N-well region 715 is not used to form a doped region in the base 760 of the BJT device 780. In other words, the N-well doping or implant process is excluded from the BJT device 780. In some embodiments, the N-well doping or implant process can be used to form at least a portion of the BJT device 780.

As shown in FIG. 7E, a reduced surface field (RESURF) oxide 720 is formed on the device 700. In some embodiments, the RESURF oxide 720 can be any combination of a thermal oxide and a deposited oxide. In some embodiments, the RESURF oxide 720 can include a thermal oxide layer disposed on a deposited oxide layer, or vice versa. In some embodiments, the thermal oxide can have a thickness of between approximately 10 Å and 1000 Å, and the deposited oxide can have a thickness of between approximately 10 Å and 1500 Å. For example, the RESURF oxide 720 can include a thermal oxide of approximately 200 Å and a deposited oxide of approximately 800 Å. Although not shown in FIG. 7E, in some embodiments, a sacrificial oxide formed on the device 700 can be removed before the RESURF oxide 720 is formed on the device 700.

FIG. 7F is a cross-sectional diagram that illustrates the device 700 after at least some portions of the RESURF oxide 720, which is shown in FIG. 7E, have been removed to form RESURF oxides 721, 722 (or portions of RESURF oxide or a RESURF oxide layer). In some embodiments, portions of the RESURF oxide 720 can be removed using one or more masking processes and/or one or more etching processes. As shown in FIG. 7F, at least a portion of the RESURF oxide 722 is disposed on the field oxide 704 in the resistor region 741. Also, at least some portions of the RESURF oxide 723 are disposed on the emitter 770 of the BJT device 780 included in the BJT region 781. Specifically, at least a portion of the RESURF oxide 723 is disposed on an exposed silicon surface (e.g., an exposed silicon surface (e.g., top surface T) of the silicon device region 705) of the emitter 770 in the BJT region 781. Also, although not labeled, a remaining portion of the RESURF oxide 720 is disposed on at least a portion of the collector 750.

Also, as shown in FIG. 7F, a portion of the RESURF oxide 721 (which is derived from RESURF oxide 720) is disposed on an exposed silicon surface (e.g., an exposed silicon surface of the silicon device region 705) of the LDMOS device 710 in the LDMOS region 711. Specifically, a portion of the RESURF oxide 721 is disposed on the HVNWELL region 712 and on the N-well region 715.

FIG. 7G is a cross-sectional diagram that illustrates formation of N-type doped drift (NDD) regions 718 concurrently formed with a base implant region 719 within the device 700. Specifically, NDD region 718 is formed in the HVNWELL region 712, and the base implant region 719 is concurrently (e.g., simultaneously) formed in the BJT region 781. The NDD region 718 can function as a drift region of the LDMOS device 710 in the LDMOS region 711. The NDD region 718 and the base implant region 719 are formed using an NDD mask 724, and an N-type implant process (e.g., a single N-type implant process). As shown in FIG. 7G, the N-type implant process used to form the NDD region 718 in the LDMOS device 710 of the LDMOS region 711 is the same N-type implant process used to form the base implant region 719 included in the base 760 of the BJT region 781. Accordingly, as shown in FIG. 7G, during at least the masking step and implanting step for the NDD region 718 (e.g., the n-type drift region), the base 760 and the emitter 770 of the BJT device 780 is also opened (e.g., exposed, unmasked) in the NDD mask 724 (which can be referred to as a drift region mask) and implanted.

As shown in FIG. 7G, the NDD region 718 and the base implant region 719 each have a depth that is greater than a depth of the N-well region 715. As discussed above, the NDD region 718 and the base implant region 719 can each have a depth that is less than a depth of the N-well region 715. As shown in FIG. 7G, the NDD region 718 and the base implant region 719 have a lateral (or horizontal) width R (from left to right, or vise versa) greater than a lateral (or horizontal) width Q of the N-well region 715.

For example, in FIG. 7G, the net charge in the base implant 719 can be less than the net charge in the N-well 715. In some embodiments, the NDD region 718 can be a drift region configured to function as an area across which voltage of the relatively high voltage LDMOS device 710 can be dropped. In other words, the high voltage characteristics of the LDMOS device 710 can be facilitate by voltage supported across the NDD region 718.

Although not shown in FIG. 7G, PDD regions can also be formed in a similar fashion for an HVLPDMOS device or HVPMOS device (not shown) and an NPN BJT device (not shown). The P-type implant used for the PDD region of the HVLPDMOS device or HVPMOS device can also be used to dope a base of the NPN BJT device. The PDD region of the HVLPDMOS device or HVPMOS device can function as a drift region of the HVLPDMOS device or HVPMOS device. In other words, in an NPN BJT device (not shown) a p-type drift region implant can be used to dope the NPN BJT device, and a P-well doping or implant can be excluded from at least one NPN BJT device.

As mentioned above, in some embodiments, in addition to BJT devices formed using the drift region implants (e.g., BJT device 780), one or more BJT devices (not shown) can be produced with base implant regions formed using a P-well process (for an NPN BJT device) and one or more BJT devices (not shown) can be produced with base implant regions formed using an N-well process (for an PNP BJT device).

FIG. 7H is a cross-sectional diagram that illustrates formation of polysilicon portions on the device 700. As shown in FIG. 7H, a gate polysilicon 726 (which also can be referred to as a gate electrode) is formed in the LDMOS region 711 and a resistor polysilicon 742 (also can be referred to as a polysilicon portion) is formed in the resistor region 741. In some embodiments, the gate polysilicon 726 and the resistor polysilicon 742 can be formed as part of a polysilicon layer. In some embodiments, the gate polysilicon 726 and the resistor polysilicon 742 can be formed as part of the same polysilicon formation process. In some embodiments, a polysilicon deposition process used to form the gate polysilicon 726 can be the same as a polysilicon deposition process used to form the resistor polysilicon 742. Accordingly, the resistor polysilicon 742 and the gate polysilicon 726 can be concurrently formed, rather than formed using different polysilicon process steps. In some embodiments, the polysilicon deposition process can include one or more masking process steps, one or more etching steps, and/or so forth.

As shown in FIG. 7H, the resistor polysilicon 742 is disposed on the RESURF oxide 722, which is disposed on the field oxide 704. Accordingly, the RESURF oxide 722 and the field oxide 704 are disposed between the resistor polysilicon 742 and the P-well region 709. In this embodiment, the BJT region 781 is excluded from polysilicon formation. Although not shown in FIG. 7H, in some embodiments, the resistor polysilicon 742 can be formed directly on the field oxide 704. In such embodiments, the RESURF oxide 722 may not be formed on (e.g., may be excluded from) at least a portion of the field oxide 704 in the resistor region 741. In other words, in some embodiments, the RESURF oxide 722 may not be disposed between the field oxide 704 and the resistor polysilicon 742.

As shown in FIG. 7H, a gate oxide 725 is formed below at least a portion of the gate polysilicon 726 (so that the gate oxide 725 is disposed between the gate polysilicon 726 and the top surface T of the silicon device region 705). As shown in FIG. 7H, the gate oxide 725 is in contact with at least a portion of the RESURF oxide 721. Specifically, an end of the gate oxide 725 is in contact with (e.g., abuts, is adjacent to) at least an end of the RESURF oxide 721. In some embodiments, the gate oxide 725 can have a thickness between 5 Å and 300 Å (e.g., 50 Å, 120 Å, 200 Å). In some embodiments, the gate oxide 725 can have a thickness that is less than a thickness of the RESURF oxide 721.

As shown in FIG. 7H, a boundary (e.g., a left-side boundary as oriented in this figure) of the NDD region 718 intersects (e.g., terminates at) an interface between the top surface T of the silicon device region 705 (which can be a top surface of an epitaxial layer) and a bottom surface of the gate oxide 725 of the LDMOS device 710. In contrast, a boundary (e.g., a left-side boundary as oriented in this figure) of the N-well region 715 can intersect an interface between the top surface T of the silicon device region 705 (which can be a top surface of an epitaxial layer) and a bottom surface of the RESURF oxide 720 of the LDMOS device 710. As shown in FIG. 7H, a boundary of the NDD region 718 (below the gate oxide 725) can be approximately the same as (e.g., corresponds with or is adjacent to) a boundary of the HVNWELL region 712.

As shown in FIG. 7H, the N-well region 715 is disposed within the NDD region 718, which is disposed within the HVNWELL region 712, and the HVNWELL region 712 is disposed between (e.g., laterally between) portions of P-well region 709. Accordingly, the N-well region 715, the NDD region 718, and the HVNWELL region 712 have different cross-sectional areas.

As shown in FIG. 7H, a boundary (e.g., a right-side boundary as oriented in this figure) of the NDD region 718 intersects (e.g., terminates at) an interface between the field oxide 704 and the silicon device region 705. In other words, the boundary (e.g., a right-side boundary as oriented in this figure) of the NDD region 718 terminates at a bottom surface of the field oxide 704. Similarly, a boundary (e.g., a right-side boundary as oriented in this figure) of the N-well region 715 also intersects (e.g., terminates at) an interface between the field oxide 704 and the silicon device region 705. In other words, the boundary (e.g., a right-side boundary as oriented in this figure) of the N-well region 715 terminates at a bottom surface of the field oxide 704. As shown in FIG. 7H, a boundary (e.g., right-side boundary as oriented in this figure) of the NDD region 718 (below the gate oxide 725) does not correspond with (e.g., is separate from) a boundary (e.g., right-side boundary as oriented in this figure) of the N-well region 715 or a boundary (e.g., right-side boundary as oriented in this figure) of the HVNWELL region 712.

FIG. 7I is a cross-sectional diagram that illustrates a P− implant mask 731 used to form P− region 732 (which can be the body region of the LNDMOS device 710) and used to dope at least a portion 733 of the gate polysilicon 726 and a portion 734 of the resistor polysilicon 742. The P− region 732 is disposed within the P− well region 709. A depth of the P− region 732 is less than a depth of the P-well region 709. As shown in FIG. 7I, the implantation process used to dope the P− region 732 is also used to dope a portion 733 of the gate polysilicon 726 and the portion 734 of the resistor polysilicon 742. Accordingly, the portion 734 of the resistor polysilicon 742 can be concurrently doped with the portion 733 of the gate polysilicon 726 and the P− region 732. The doping of the P− region 732 and portions 733,734 can be a relatively light doping (e.g., lighter in concentration than a concentration of the P-well region 709) performed using a P-type dopant. At least a portion (e.g., a middle portion along a top portion) of the portion 734 can define a resistor body region 735 of the resistor polysilicon 742. In other words, during the LDMOS device 710 body implant, the P-implant mask can be opened (e.g., exposed, unmasked) around the resistor polysilicon 742 so that the resistor polysilicon 742 can be doped. The P− region 732 is disposed within at least one portion of the P-well region 709.

The portion 734 of the resistor polysilicon 742 can include at least some portions of the resistor body region 735 of the resistor polysilicon 742. Examples of a resistor body region of a polysilicon resistor are shown and described above in connection with at least FIGS. 1 and 2. In some embodiments, the P− implant mask 731 (which can be referred to as a body implant mask) can be formed so that only the resistor body region 735 of the resistor polysilicon 742 is doped. The P− region 732 can have a dopant concentration that is lower than (e.g., an order of magnitude lower than) a dopant concentration of the P-well region 709.

In some embodiments, the resistor polysilicon 742 can be doped with the same implant process (or steps thereof) used to dope the P− region 732 as well as an N-type implant used to dope a source of the LDMOS device 710. In some embodiments, the source implant can be formed during a source/drain (S/D) implantation related to an NMOS process.

FIG. 7J is cross-sectional diagram illustrating N-type lightly doped drain (NLDD) regions 736, 737 formed using an NLDD implant mask 739. As shown in FIG. 7J, at least a portion 738 of the gate polysilicon 726 is also doped during the NLDD implant process. Although not shown in FIG. 7J, a P-type LDD implant can also be performed. In some embodiments, the gate seal oxidation process (not shown) can be performed before an NLDD implant process is performed and/or before a PLDD implant process is performed. As shown in FIG. 7J, the resistor region 741 and the BJT region 781 are excluded from the NLDD implant process. In some embodiments, at least some portions of the resistor region 741 and/or the BJT region 781 can be exposed to the NLDD implant. For example, at least a portion of (e.g., a resistor body region of) the resistor polysilicon 742 can be exposed to the NLDD implant.

As shown in FIG. 7K, a tetraethylorthosilicate (TEOS) deposition and etch to form spacers 751 for the LDMOS device 710 and spacers 752 for the polysilicon resistor 740 are performed. The spacers 751 and the spacers 752 can be formed using a spacer etch back process.

After the spacers 751, 752 have been formed, each end of the resistor polysilicon 742 is doped with a P+ implant process (which is a type of source implant process and/or drain implant process) using a P+ implant mask 753 (which can be referred to as a source mask and/or as a drain mask) to form P+ regions 755, 756. The P+ implant mask can be associated with a P+ source/drain (S/D) implant of a PMOS device (not shown). The ends (or contact regions) of the resistor polysilicon 742 can be further doped with a P-type dopant so that ohmic (rather than rectifying) contacts can be later formed using (or via) the P+ regions 755, 756 of the polysilicon resistor 740. As shown in FIG. 7K, end portions of the resistor polysilicon 742, which have been previously doped, are unmasked with (or exposed through) the P+ implant mask 753 to form the P+ regions 755, 756. In some embodiments, the P+ regions can be referred to as contact regions of the polysilicon resistor 740. The resistor body region 735 (shown in FIG. 7I, for example) can be disposed between the P+ regions 755, 756.

Also, as shown in FIG. 7K, the emitter 770 of the BJT device 780 is doped with the P+ implant to form a P+ region 757 within the base implant region 719. Accordingly, at least some portions of the polysilicon resistor 740 and at least some portions of the BJT device 780 can be concurrently doped with a P+ implantation process associated with a PMOS device. As shown in FIG. 7K, the collector 750 also includes a P+ region 758.

In this embodiment, the P+ implant only is shown. In some embodiments, an N+ source/drain implant associated with an NMOS device (not shown) can also be performed. Although not shown in this embodiment, at least some portions of a polysilicon resistor (not shown) and at least some portions of an NPN BJT device (not shown) can be concurrently doped with an N+ implantation process associated with an NMOS device.

After the P+ implant process has been performed, a salicide oxide 761 is formed (e.g., deposited, grown) on the device 700. In some embodiments, the salicide oxide 761 can be referred to as a salicide blocking oxide. Accordingly, during the salicide processing, the salicide is disposed (e.g., formed) on the P+ regions 755, 756 of the resistor polysilicon 742, but is not disposed on the resistor body, central P-doped portion of the resistor polysilicon 742 disposed between the P+ regions 755, 756 (which is doped with the LNDMOS P-type body implant).

The salicide oxide 761 can be etched (i.e., patterned such that the salicide oxide 761 is removed, except in areas where the formation of salicide is not desired such as the central P-doped portion of the resistor polysilicon 742) so that salicide 791, 792, and 793 can be formed using a metal, respectively, on the gate, source, and drain of the LDMOS device 710 as shown in FIG. 7M. Also, salicide 794 and 795 are formed on each end (on the P+ regions 755 and 756, respectively) of the polysilicon resistor 740. Finally, salicide 796, 797, and 798 are formed on each of the collector 750, based 760, and emitter 770, respectively, of the BJT device 780. Process steps subsequent to formation of the salicide such as contact formation, passivation, metallization, dielectric and via formation, are not shown.

In some embodiments, additional types of semiconductor structures can be included in the device 700. For example, a capacitor device can be formed in the device 700 in addition to the BJT device 780, the polysilicon resistor 740, and the LDMOS device 710.

FIG. 8 is a diagram that illustrates a table related to electrical parameters of BJT devices described herein. As shown in FIG. 8, the electrical parameters 800 include a beta (β) value, a breakdown voltage between collector and emitter with the base terminal being open (BVceo), and a breakdown voltage between collector and base with the emitter terminal being open (BVcbo). In this embodiment, the values of the electrical parameters 800 have been normalized.

Specifically, as shown in FIG. 8, electrical parameters 800 of an NPN BJT device with a base implant region being formed concurrently with a drift region of an LDMOS device (shown as NPN BJT with Drift Region 810) are normalized to electrical parameters 800 of an NPN BJT device with a P-well as the base (shown as NPN BJT with P-Well 820). The beta value of the NPN BJT with Drift Region 810 is approximately 4 times greater than the beta value of the NPN BJT with P-Well 820. For example, if the beta value of the NPN BJT with P-Well 820 is approximately 10, the beta value of the NPN BJT with Drift Region 810 will be approximately 40 or more. In some embodiments, the ratio of the beta value of the NPN BJT with Drift Region 810 to the beta value of the NPN BJT with P-Well 820 can be greater than 4:1 (e.g., 5:1, 10:1) or less than 4:1 (e.g., 3:1, 2:1).

Both the BVceo Value and the BVcbo Value of the NPN BJT with Drift Region 810 are approximately two times greater, respectively, than the BVceo Value and the BVcbo Value of the NPN BJT with P-Well 820. For example, if the BVceo Value of the NPN BJT with P-Well 820 is approximately 25, the BVceo Value of the NPN BJT with Drift Region 810 will be approximately 50 or more. In some embodiments, the ratio of the BVceo Value of the NPN BJT with Drift Region 810 to the beta value of the NPN BJT with P-Well 820 can be greater than 2:1 (e.g., 3:1,4:1) or less than 2:1 (e.g., 1.5:1). As another example, if the BVcbo Value of the NPN BJT with P-Well 820 is approximately 25 the BVcbo Value of the NPN BJT with Drift Region 810 will be approximately 50 or more. In some embodiments, the ratio of the BVcbo Value of the NPN BJT with Drift Region 810 to the beta value of the NPN BJT with P-Well 820 can be greater than 2:1 (e.g., 3:1,4:1) or less than 2:1 (e.g., 1.5:1).

Also, as shown in FIG. 8, electrical parameters 800 of a PNP BJT device with a base implant region being formed concurrently with a drift region of an LDMOS device (shown as PNP BJT with Drift Region 830) are normalized to electrical parameters 800 of an PNP BJT device with a N-well as the base (shown as PNP BJT with N-Well 840). The beta value of the PNP BJT with Drift Region 830 is approximately 4 times greater than the beta value of the PNP BJT with N-Well 840. For example, if the beta value of the PNP BJT with N-Well 840 is approximately 5, the beta value of the PNP BJT with Drift Region 830 will be approximately 20 or more. In some embodiments, the ratio of the beta value of the PNP BJT with Drift Region 830 to the beta value of the PNP BJT with N-Well 840 can be greater than 4:1 (e.g., 5:1, 10:1) or less than 4:1 (e.g., 3:1, 2:1).

Both the BVceo Value and the BVcbo Value of the PNP BJT with Drift Region 830 are approximately the same, respectively, as the BVceo Value and the BVcbo Value of the PNP BJT with N-Well 840. For example, if the BVceo Value of the PNP BJT with N-Well 840 is approximately 25, the BVceo Value of the PNP BJT with Drift Region 830 will be approximately 25 or more. In some embodiments, the ratio of the BVceo Value of the PNP BJT with Drift Region 830 to the beta value of the PNP BJT with N-Well 840 can be greater than 1:1 (e.g., 1.5:1, 2:1) or less than 1:1 (e.g., 0.75:1). As another example, if the BVcbo Value of the PNP BJT with N-Well 840 is approximately 25 the BVcbo Value of the PNP BJT with Drift Region 830 will be approximately 25 or more. In some embodiments, the ratio of the BVcbo Value of the PNP BJT with Drift Region 830 to the beta value of the PNP BJT with N-Well 840 can be greater than 1:1 (e.g., 1.5:1, 2:1) or less than 1:1 (e.g., 0.75:1).

Figure 9:
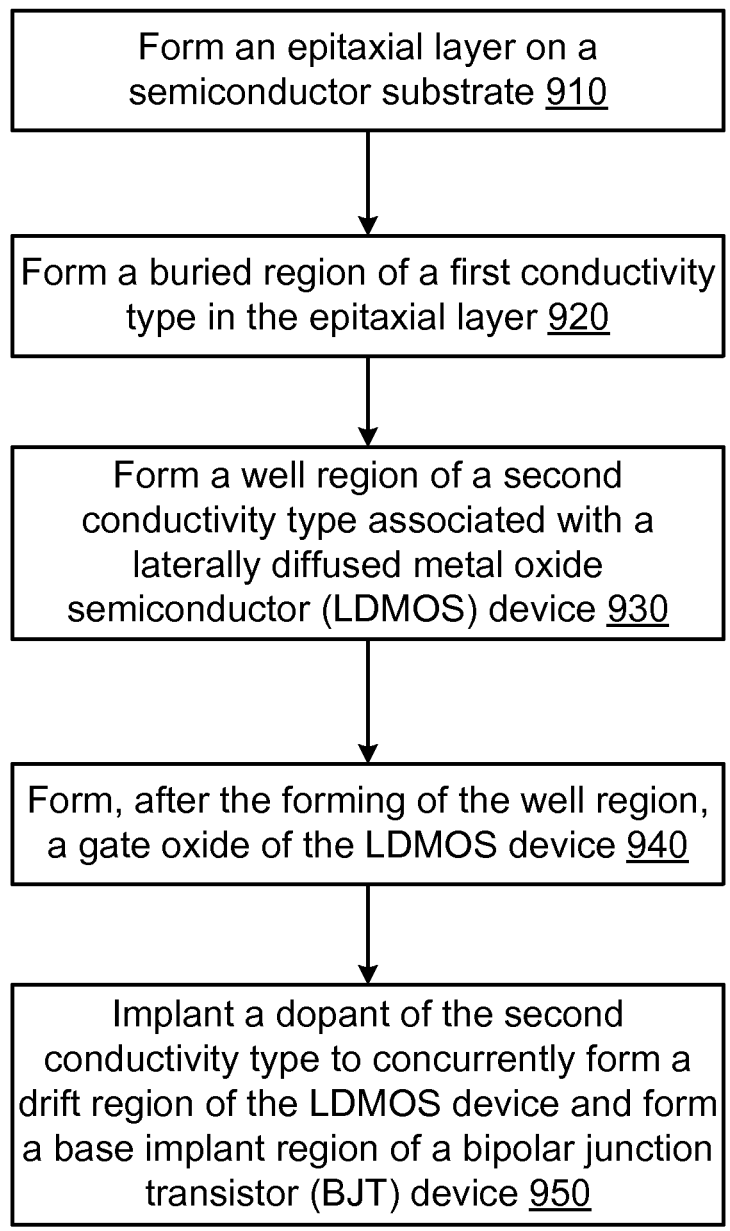
FIG. 9 is a flowchart that illustrates a method of forming a BJT device.

FIG. 9 is a flowchart that illustrates a method of forming a BJT device. This flowchart can include process steps from at least some portions of the semiconductor processing described above. In some embodiments, the semiconductor process can be related to a BCDMOS process.

As shown in FIG. 9, an epitaxial layer is formed on a semiconductor substrate (block 910). In some embodiments, more than one epitaxial layer can be formed on the semiconductor substrate.

A buried region of a first conductivity type is formed in the epitaxial layer (block 920). In some embodiments, multiple buried regions of different conductivity types can be formed in the epitaxial layer. In some embodiments, the buried region of the first conductivity type can be formed after a first epitaxial layer has been formed, and a second epitaxial layer can be formed above the buried region.

A well region of a second conductivity type associated with a laterally diffused metal oxide semiconductor (LDMOS) device is formed (block 930). In some embodiments, the well region can be formed within a high voltage well region (e.g., an HVNWELL region) having a larger cross-sectional area than the well region.

After the forming of the well region, a gate oxide of the LDMOS device is formed (block 940). In some embodiments, the gate oxide can be formed on a top surface of a silicon device region of the semiconductor device. In some embodiments, the gate oxide can be formed after a field oxide and/or a RESURF oxide which can include multiple different types of oxide are formed.

A dopant of the second conductivity type is implanted to concurrently form a drift region of the LDMOS device and form a base implant region of a bipolar junction transistor (BJT) device (block 950). In some embodiments, the drift region can have a boundary intersecting an interface between a top surface of the epitaxial layer and the gate oxide of the LDMOS device.

Figure 10:
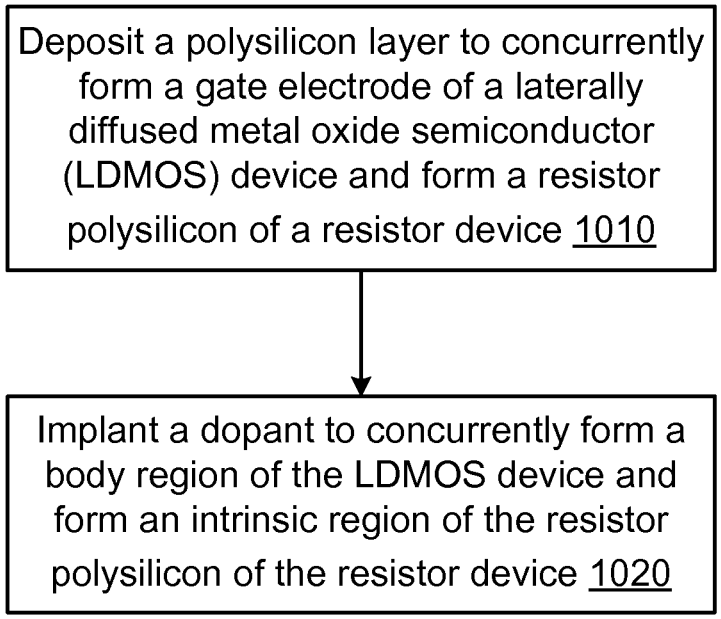
FIG. 10 is a flowchart that illustrates a method of forming a resistor device.

FIG. 10 is a flowchart that illustrates a method of forming a resistor device. This flowchart can include process steps from at least some portions of the semiconductor processing described above. In some embodiments, the semiconductor process can be related to a BCDMOS process.

As shown in FIG. 10, a polysilicon layer is deposited to concurrently form a gate electrode of a laterally diffused metal oxide semiconductor (LDMOS) device and form a resistor polysilicon of a resistor device (block 1010). In some embodiments, the resistor polysilicon can be formed on at least a portion of a field oxide that is previously formed. In some embodiments, the gate electrode and the resistor polysilicon can be formed on different portions of a RESURF oxide.

Implant a dopant to concurrently form a body region of the LDMOS device and form a resistor body region of the resistor polysilicon of the resistor device (block 1020). In some embodiments, the resistor body region can be disposed between contact regions later formed in the resistor polysilicon of the resistor device.

Figure 11:
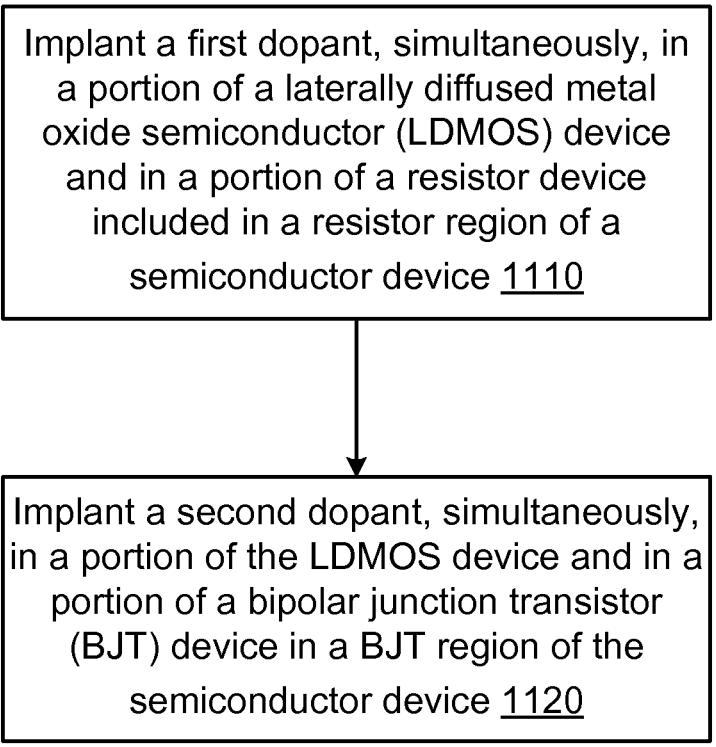
FIG. 11 is a flowchart that illustrates a method of forming a resistor device and a BJT device.

FIG. 11 is a flowchart that illustrates a method of forming a resistor device and a BJT device. This flowchart can include process steps from at least some portions of the semiconductor processing described above. In some embodiments, the semiconductor process can be related to a BCDMOS process.

A first dopant is implanted, simultaneously, in a portion of a laterally diffused metal oxide semiconductor (LDMOS) device and in a portion of a resistor device included in a resistor region of a semiconductor device (block 1110). In some embodiments, the portion of the resistor device is a resistor body region of a polysilicon portion of the resistor device.

A second dopant is implanted, simultaneously, in a portion of the LDMOS device and in a portion of a bipolar junction transistor (BJT) device in a BJT region of the semiconductor device (block 1120). In some embodiments, the portion of the BJT device is a base implant region.

Figure 12:
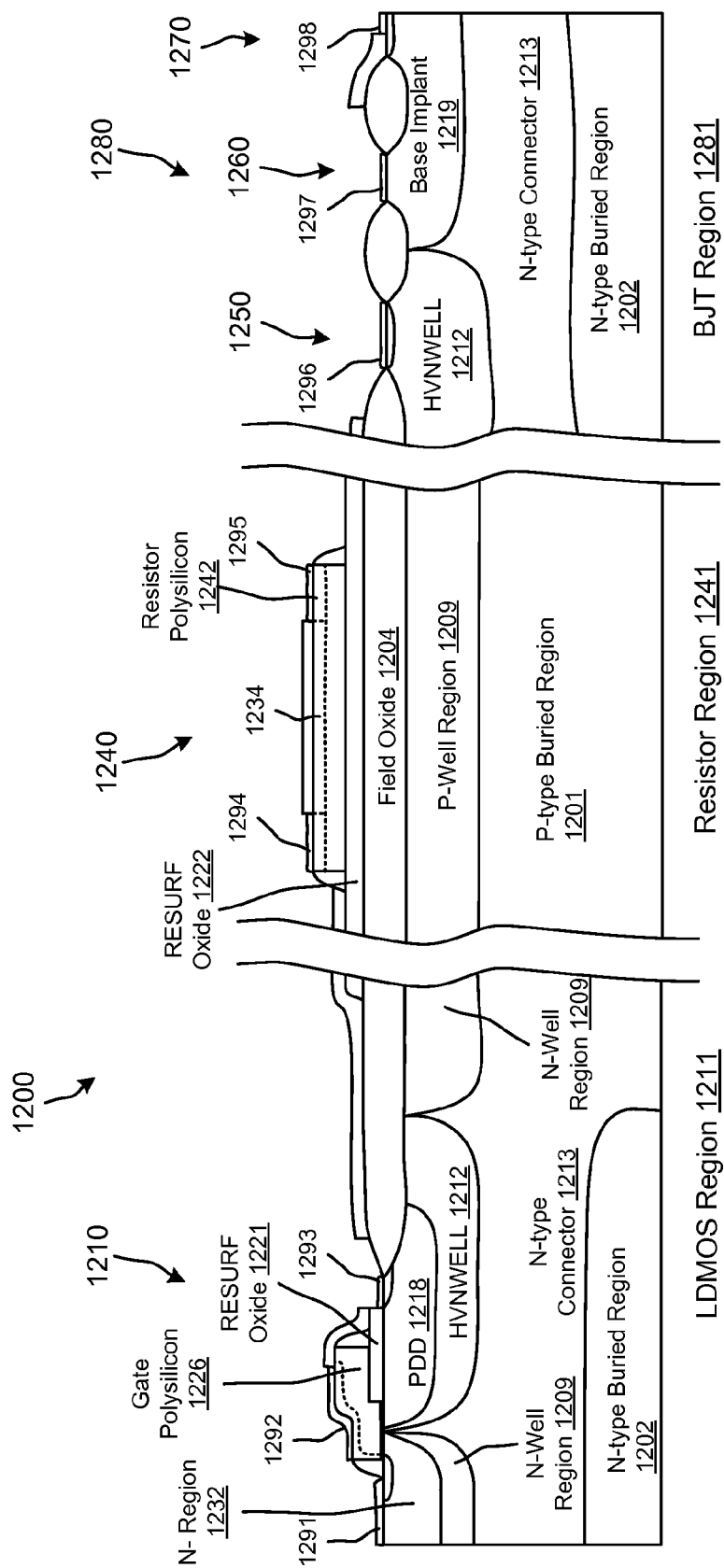
FIG. 12 is a diagram that illustrates an NPN device, a P-type laterally diffused metal oxide semiconductor (LDMOS) device, and a resistor device.

FIG. 12 is a diagram that illustrates an NPN device 1280, a P-type LDMOS device 1210, and a polysilicon resistor 1240. The process steps used to form the devices shown in FIG. 12 can be similar to the process steps used to form the devices shown in FIGS. 7A through 7M. Specifically, in this embodiment, portions of the polysilicon resistor 1240 and/or the BJT device 1280 can be produced using one or more process steps within a semiconductor process overlapping or corresponding with one or more process steps used to produce the LDMOS device 1210. The LDMOS device 1210, the polysilicon resistor 1240, and the BJT device 1280 are integrated in a device 1200 (also can be referred to as an integrated circuit). The LDMOS device 1210 is produced within an LDMOS region 1211 of the device 1200, the polysilicon resistor 1240 is produced within a resistor region 1241 of the device 1200, and the BJT device 1280 is produced within a BJT region 1281 of device 1200. As shown in FIG. 12, the BJT device 1280 includes a collector 1250, a base 1260, and an emitter 1270. FIG. 12 illustrates a field oxide 1204, a RESURF oxide 1222, an N-Region 1232, and salicide portions 1291-1298.

As shown in FIG. 12, the device 1200 includes a substrate 1203 and an N-type buried region 1202. The LDMOS region 1211 and the BJT region 1281 each include at lest a portion of an N-type connector 1213. A P-type buried region 1201 and the N-type buried region 1202 can be formed using a series of process steps including implantation process steps, oxidation process steps epitaxial growth steps, and/or so forth. In some embodiments, at least a portion of the N-type buried region 1202 and the P-type buried region 1201 can be formed in one or more epitaxial layers (e.g., P-type epitaxial layers) that are serially formed (e.g., formed in a stack fashion, formed above one another during different time periods with intervening process steps or layers). For example, a first P-type epitaxial layer can be formed on the substrate 1203 and a second P-type epitaxial layer can be formed on the first P-type epitaxial layer.

As shown in FIG. 12, a high voltage N-well (HVNWELL) region 1212 (e.g., a first and second HVNWELL region) is formed in each of the LDMOS region 1211 and in the BJT region 1281. In some embodiments, the HVNWELL region 1212 can be formed around (e.g., below, with a larger cross-sectional area than) one or more of the N-well regions 1209.

In this embodiment, an implant process used to form the P-type doped drift (PDD) region 1218 is used to also form the base implant 1219. Specifically, PDD region 1218 is formed in the HVNWELL region 1212, and the base implant region 1219 is concurrently (e.g., simultaneously) formed in the BJT region 1281. The PDD region 1218 can function as a drift region of the LDMOS device 1210 in the LDMOS region 1211. The PDD region 1218 and the base implant region 1219 are formed using a PDD mask 1224, and a P-type implant process (e.g., a single P-type implant process). As shown in FIG. 12G, the P-type implant process used to form the PDD region 1218 in the LDMOS device 1210 of the LDMOS region 1211 is the same P-type implant process used to form the base implant region 1219 included in the base 1260 of the BJT region 1281. Accordingly, as shown in FIG. 12, during at least the masking step and implanting step for the PDD region 1218 (e.g., the n-type drift region), the base 1260 and the emitter 1270 of the BJT device 1280 is also opened (e.g., exposed, unmasked) in a PDD mask (not shown) (which can be referred to as a drift region mask) and implanted.

Also a P-implant mask used to form a P-region (not shown) (which can be the body region of an LNDMOS device) can be used to dope at least a portion of the gate polysilicon 1226 and a portion 1234 of the resistor polysilicon 1242. Various processing steps in related to doping the gate polysilicon 1226 are described above in connection with FIG. 7.

Although not shown, in some embodiments, additional types of semiconductor structures can be included in the device 1200. For example, a capacitor device can be formed in the device 1200 in addition to the BJT device 1280, the polysilicon resistor 1240, and the LDMOS device 1210.

Implementations of the various techniques described herein may be implemented in digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A method, comprising:
   forming an epitaxial layer on a semiconductor substrate;
   forming a buried region of a first conductivity type in the epitaxial layer;
   forming a well region of a second conductivity type in a laterally diffused metal oxide semiconductor (LDMOS) device;
   forming a reduced surface field (RESURF) oxide of the LDMOS device;
   forming a well region of the first conductivity type in the LDMOS device without concurrently forming a region of the first conductivity type in a bipolar junction transistor (BJT) device;
   forming, after forming the well region of the second conductivity type and after the forming the RESURF oxide, a gate oxide of the LDMOS device in contact with the RESURF oxide; and
   implanting a dopant of the second conductivity type to concurrently form a drift region of the LDMOS device and a base implant region of the BJT device, the drift region having a boundary intersecting an interface between a top surface of the epitaxial layer and the gate oxide of the LDMOS device.

2. The method of claim 1, wherein the base implant region has a depth less than a depth of the well region of the LDMOS device.

3. The method of claim 1, wherein a depth of the drift region is the same as a depth of the base implant region.

4. The method of claim 1, wherein the BJT device has a current gain value greater than 20.

5. The method of claim 1, wherein the BJT device is a PNP device, the LDMOS device is an N-type LDMOS device, and the base implant region has an N-type conductivity.

6. The method of claim 1, wherein the BJT device is an NPN device, the LDMOS device is a P-type LDMOS device, and the base implant region has a P-type conductivity.

7. The method of claim 1, further comprising:
   implanting, concurrently, the dopant to form a body region of the LDMOS device and a resistor body region of a resistor polysilicon of a resistor device.

8. The method of claim 1, wherein the semiconductor substrate includes silicon carbide.

9. The method of claim 1, forming, concurrently, a first silicide in the BJT device, a second silicide in the LDMOS device, and a third silicide in a resistor device.

10. The method of claim 1, wherein the implanting of the dopant is performed within a semiconductor device including the BJT device, a complementary metal oxide semiconductor (CMOS) device, and the LDMOS device.

11. The method of claim 1, wherein the RESURF oxide has a thickness greater than a thickness of the gate oxide.

12. A method, comprising:
    forming an epitaxial layer including a buried region having a first conductivity type on a semiconductor substrate;
    forming a field oxide and a well region of a second conductivity type in an LDMOS device;
    forming a reduced surface field (RESURF) oxide in a laterally diffused metal oxide semiconductor (LDMOS) region of the LDMOS device after the forming the field oxide;
    forming a well region of the first conductivity type in the LDMOS device without concurrently forming a region of the first conductivity type in a bipolar junction transistor (BJT) device;
    forming, after forming the RESURF oxide and after the forming the field oxide, a gate oxide of the LDMOS device; and
    implanting a dopant of the second conductivity type to concurrently form a drift region of the LDMOS device and a base implant region of the BJT device, the drift region having a boundary intersecting an interface between a top surface of the epitaxial layer and the gate oxide of the LDMOS device.

13. The method of claim 12, wherein the RESURF oxide and the field oxide each have a thickness greater than a thickness of the gate oxide.

14. The method of claim 12, wherein the field oxide is formed over the well region, and the base implant region has a depth less than a depth of the well region of the LDMOS device.

15. The method of claim 12, wherein the base implant region has a depth greater than a depth of the well region of the LDMOS device.

16. The method of claim 12, forming, concurrently, a first silicide in the BJT device, a second silicide in the LDMOS device, and a third silicide in a resistor device.

17. A method, comprising:
    forming an epitaxial layer on a semiconductor substrate including a buried region having a first conductivity type;
    forming a well region of a second conductivity type associated with a laterally diffused metal oxide semiconductor (LDMOS) device and a field oxide over at least a portion of the well region of the second conductivity type;
    forming a reduced surface field (RESURF) oxide of the LDMOS device after the forming the field oxide;

forming a well region of the first conductivity type in the LDMOS device without concurrently forming a region of the first conductivity type in a bipolar junction transistor (BJT) device;

forming, after forming the RESURF oxide and after the forming the field oxide, a gate oxide of the LDMOS device; and implanting a dopant, simultaneously, through a first portion of the RESURF oxide in a portion of the LDMOS device and through a second portion of the RESURF oxide in a portion of the BJT device.

18. The method of claim 17, wherein the portion of the LDMOS device is a drift region of the LDMOS device that has a boundary intersecting an interface between a top surface of the epitaxial layer and the gate oxide of the LDMOS device, the portion of the BJT device is a base implant region.

19. The method of claim 17, wherein the dopant is a first dopant, the method further comprising:
implanting a second dopant, simultaneously, in the LDMOS device and in a portion of a resistor device.

20. The method of claim 19, wherein the portion of the resistor device is a resistor region of a polysilicon portion of the resistor device.

* * * * *

UNITED STATES PATENT AND TRADEMARK OFFICE
CERTIFICATE OF CORRECTION

| | |
|---|---|
| PATENT NO. | : 9,117,845 B2 |
| APPLICATION NO. | : 13/751041 |
| DATED | : August 25, 2015 |
| INVENTOR(S) | : Christopher Nassar et al. |

It is certified that error appears in the above-identified patent and that said Letters Patent is hereby corrected as shown below:

ON THE TITLE PAGE

Item (54), in column 1, in "Title", line 1, delete "DIFFUSED" and insert -- DIFFUSED METAL --, therefor.

IN THE SPECIFICATION

In column 1, line 1, delete "DIFFUSED" and insert -- DIFFUSED METAL --, therefor.

Signed and Sealed this
Sixteenth Day of February, 2016

Michelle K. Lee
*Director of the United States Patent and Trademark Office*